United States Patent [19]  
Matsumoto

[11] Patent Number: 4,763,331  
[45] Date of Patent: Aug. 9, 1988

[54] METHOD FOR DECODING ERROR CORRECTING BLOCK CODES

[75] Inventor: Tadashi Matsumoto, Yokosuka, Japan

[73] Assignee: Nippon Telegraph and Telephone Corporation, Tokyo, Japan

[21] Appl. No.: 937,176

[22] Filed: Dec. 2, 1986

[30] Foreign Application Priority Data

Dec. 11, 1985 [JP] Japan ................................ 60-278276  
Dec. 20, 1985 [JP] Japan ................................ 60-288934  
May 26, 1986 [JP] Japan ................................ 61-121698  
Jul. 2, 1986 [JP] Japan ................................ 61-157034

[51] Int. Cl.$^4$ ............................................. G06F 11/10  
[52] U.S. Cl. ........................................... 371/37; 371/43  
[58] Field of Search ................... 371/37, 42, 38, 43, 371/31, 40, 44, 41, 45

[56] References Cited  
U.S. PATENT DOCUMENTS 4,130,818 12/1978 Snyder .................................. 371/43  
4,476,458 10/1984 Dollard ................................ 371/43  
4,519,080 5/1985 Snyder .................................. 371/43  
4,653,053 3/1987 Pelchat ................................ 371/43

Primary Examiner—Michael R. Fleming  
Attorney, Agent, or Firm—Pollock, Vande Sande and Priddy

[57] ABSTRACT

A soft decision decoding method which decodes a code having redundant bits added to information data bits and transmitted as an error correcting code and in which the received code is decoded bit by bit to produce a received word and reliability information for respective digits at which the received word and each of candidate code words disagree with each other is summed up. The receiving electric field level is detected for each digit of the received code, and the reliability information is obtained from the detected receiving electric field level.

16 Claims, 22 Drawing Sheets

| $x_j$\\$i$ | 1 | 2 | 3 | 4 | 5 | 6 | 7 | LEFT SIDE OF EXPRESSION (7') | LEFT SIDE OF EXPRESSION (17) | LEFT SIDE OF EXPRESSION (1) |
|---|---|---|---|---|---|---|---|---|---|---|
| $x_0$  | 0 | 0 | 0 | 0 | 0 | 0 | 0 | 3 | 9  | 36 |
| $x_1$  | 1 | 0 | 0 | 0 | 1 | 0 | 1 | 0 | 2  | 6  |
| $x_2$  | 0 | 1 | 0 | 0 | 1 | 1 | 1 | 3 | 5  | 23 |
| $x_3$  | 1 | 1 | 0 | 0 | 0 | 1 | 0 | 3 | 10 | 33 |
| $x_4$  | 0 | 0 | 1 | 0 | 1 | 1 | 0 | 3 | 8  | 33 |
| $x_5$  | 1 | 0 | 1 | 0 | 0 | 1 | 1 | 2 | 7  | 23 |
| $x_6$  | 0 | 1 | 1 | 0 | 0 | 0 | 1 | 4 | 12 | 46 |
| $x_7$  | 1 | 1 | 1 | 0 | 1 | 0 | 0 | 2 | 11 | 36 |
| $x_8$  | 0 | 0 | 0 | 1 | 0 | 1 | 1 | 3 | 4  | 20 |
| $x_9$  | 1 | 0 | 0 | 1 | 1 | 1 | 0 | 1 | 3  | 10 |
| $x_{10}$ | 0 | 1 | 0 | 1 | 1 | 0 | 0 | 2 | 8  | 33 |
| $x_{11}$ | 1 | 1 | 0 | 1 | 0 | 0 | 1 | 2 | 7  | 23 |
| $x_{12}$ | 0 | 0 | 1 | 1 | 1 | 0 | 1 | 2 | 5  | 23 |
| $x_{13}$ | 1 | 0 | 1 | 1 | 0 | 0 | 0 | 2 | 10 | 33 |
| $x_{14}$ | 0 | 1 | 1 | 1 | 0 | 1 | 0 | 5 | 13 | 50 |
| $x_{15}$ | 1 | 1 | 1 | 1 | 1 | 1 | 1 | 3 | 6  | 20 |

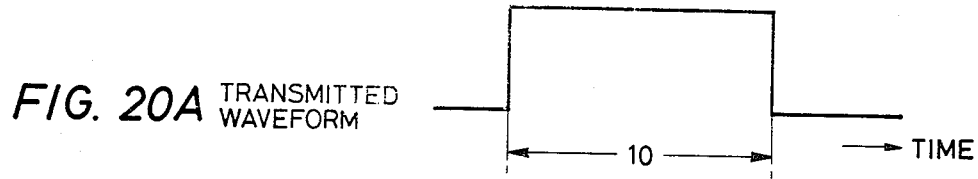
FIG. 20A TRANSMITTED WAVEFORM
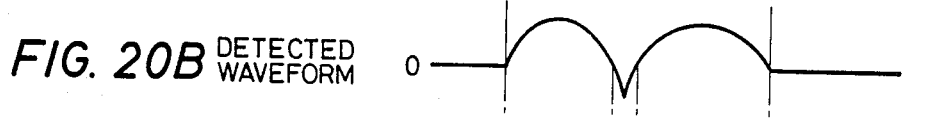
FIG. 20B DETECTED WAVEFORM
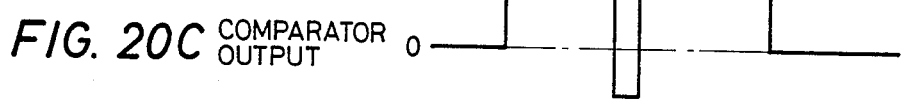
FIG. 20C COMPARATOR OUTPUT
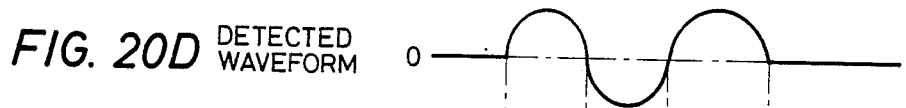
FIG. 20D DETECTED WAVEFORM
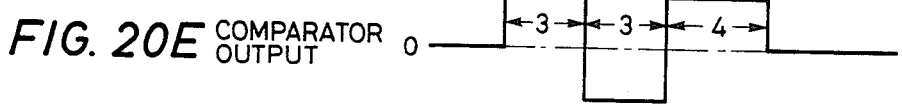
FIG. 20E COMPARATOR OUTPUT
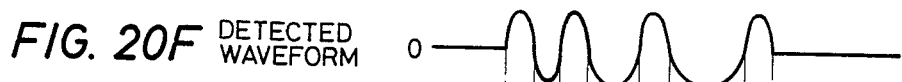
FIG. 20F DETECTED WAVEFORM
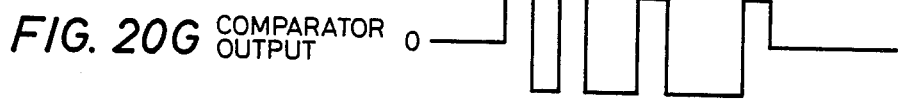
FIG. 20G COMPARATOR OUTPUT

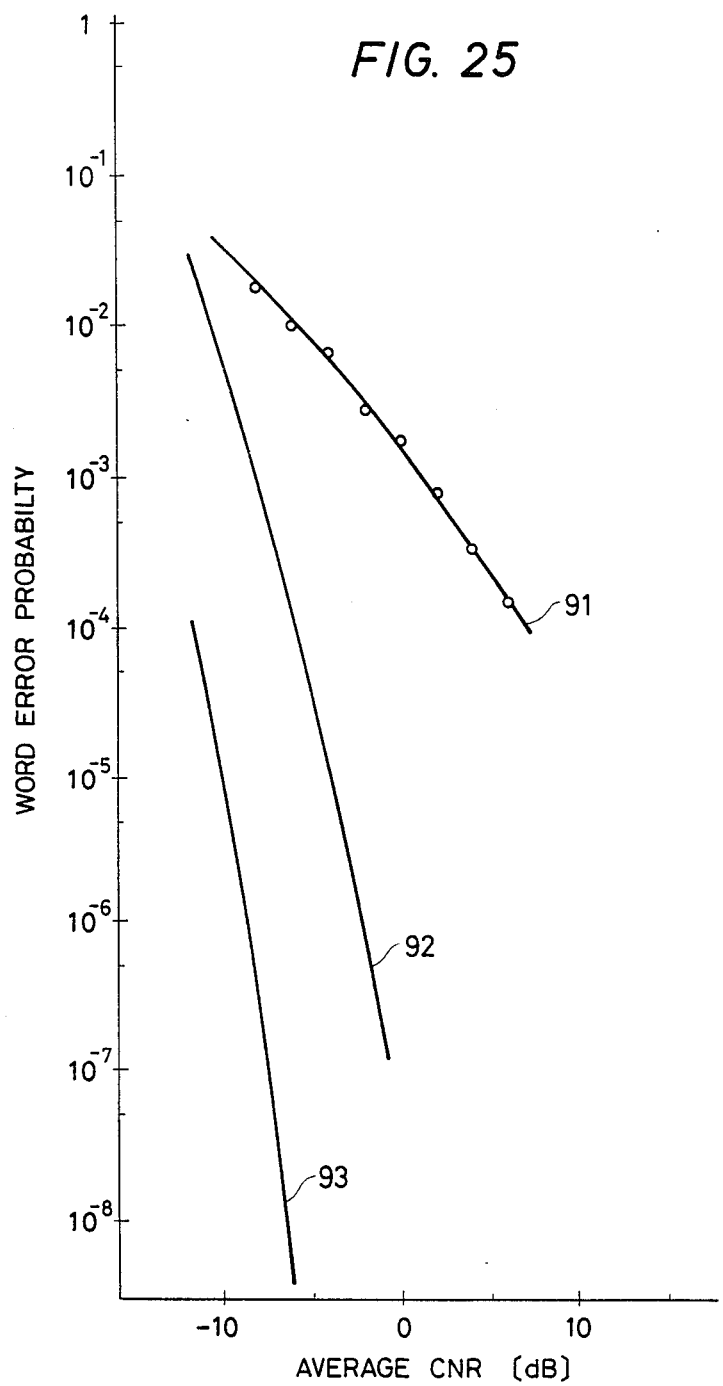

METHOD FOR DECODING ERROR CORRECTING BLOCK CODES

BACKGROUND OF THE INVENTION

The present invention relates to a method for decoding a code having redundant bits added to information bits and transmitted as an error correcting block code, and more particularly to a method for decoding an error correcting block code which is suitable for use in, for example, a data transmission system for land mobile radio communication employing a frequency modulation communication system.

As is well-known in the art, data transmission in mobile communication suffers code errors which are caused by deep and high-speed fading which occur in the transmission line. It is therefore indispensable to effect some error control scheme. In the environment of mobile communication in which the pattern of errors undergoes various changes with the fluctuation in the fading pitch, it is considered suitable to use a random error correcting block code whose error correcting capability depends solely on the number of errors in a frame of error correcting block code.

For decoding this error correcting block code, there has been employed minimum distance decoding whose error correcting capability relies only upon algebraic redundancy of the code. However, the minimum distance decoding determines a code word closest to a received word on the basis of the algebraic property of the code, and the error probability of each digit of the received word does not attribute to the decoding. That is, the error probability of respective digits are all regarded as equal, and the decoding becomes erroneous when the number of error bits exceeds a value allowed by the error correcting capability which depends on the code distance.

On the other hand, there has been proposed maximum likelihood decoding, according to which the probabilities of code words regarded to have been transmitted are calculated using the error probability of each bit, and a code word with the maximum probability is delivered as the result of decoding. This maximum likelihood decoding permits the correction of errors exceeding in number the error correcting capability.

When the error probabilities of all digits of the received word are equal, the minimum distance decoding is equivalent to the maximum likelihood decoding, but not so when the error probabilities of the respective digits are different as in the case of mobile communication Conversely, there is the possibility, in mobile digital communication, that the word error rate characteristic can be improved by employing the maximum likelihood decoding. It is considered to be rather natural to use the maximum likelihood decoding in mobile digital communication in which the receiving electric field level, that is, the received carrier level greatly fluctuates.

For example, in conventional mobile communication systems, improvement of reliability by diversity and improvement of reliability by error correction are handled independently of each other. On this account, information representing the reliability of each bit, which is obtained in diversity reception, is not utilized at all in decoding error correcting codes. In a conventional space diversity reception system, a plurality of receiving antennas $1_1$ through $1_M$ are disposed apart, as shown in FIG. 1. Each code is transmitted in the form of an error correcting code from the transmitting side, and the same transmitted signal is received by the receiving antennas $1_1$ to $1_M$, from which the received signals are applied to receivers $2_1$ through $2_M$ for demodulation. The receivers $2_1$ through $2_M$ also provide received carrier levels to a selection circuit 11, wherein the maximum one of the received carrier levels (or carrier-to-noise ratios) is selected. In accordance with the result of selection by the selection circuit 11 the demodulated output corresponding to the maximum received signal level is selected from the demodulated outputs of the receivers $2_1$ to $2_M$ via a diversity switch 12, and is applied to an error correcting code decoder 13, wherein it is subjected to error correcting code decoding, the decoded output being provided at an output terminal 14. Incidentally, the M receiving systems made up of the receiving antennas $1_1$ to $1_M$ and the receivers $2_1$ to $2_M$ corresponding thereto are called receiving branches.

In addition to the above system in which a plurality of receiving antennas are disposed spatially apart, there are some other diversity systems such as a frequency diversity system in which the same code is transmitted over plural channels of different frequency bands and a time diversity system in which the same code is transmitted a plurality of times in a time sequence. In this case, the demodulation output with the maximum carrier-to-noise ratio (hereinafter referred to as a CN ratio or CNR) or received carrier level is selected. The receiver system corresponding to each transmitting system is called a receiving branch.

According to the diversity reception system, the demodulated output is always obtained from the receiving branch whose received carrier level is maximum, and the error correcting decoding is carried out in the selected receiving branch, thereby improving the deteriorated transmission reliability which is caused by variations in the received carrier level such as fading.

In this system, however, since the bitwise decoding based on the condition of the maximum received carrier level and the decoding of the error correcting code are entirely independent of each other, information on the reliability of selection in the diversity reception is not ever made use of in the decoding of the error correcting code. Accordingly, even in the case where a certain bit in the receiving branch with the maximum received carrier level is erroneous but the corresponding bits in the other receiving branches are received correctly, the correct bits are not utilized and the error at the bit in the receiving branch with the maximum received carrier level affects the decoding of the error correcting code. When bit errors occur in excess of the capability of the error correcting code, the frame is rejected or decoded erroneously.

On the other hand, soft decision decoding which utilizes level information in the bitwise decoding for the decoding of a block code has been introduced in literature [D. Chase, "A Class Of Algorithms For Decoding Block Codes With Channel Measurement Information", IEEE Trans. IT-18, No. 1, Jan. 1972], and it is set forth in this literature that the error correcting capability of the block code can be extended by the soft decision decoding.

According to this method, a code word $X_j$ which satisfies the following expression (1) is delivered as the decoded output:

$$\sum_{i=1}^{N} |l_i|(Y_i \oplus X_{ji}) \rightarrow \min_{X_j \in \Omega_x} \quad (1)$$

In the above, $\Omega_x$: whole set of code words X
$X_j$: j-th code word in the set $\Omega_x$
$X_{ji}$: i-th digit of the code word $X_j$
$X_j = (X_{j1}, X_{j2}, \ldots, X_{ji}, \ldots, X_{jN})$
$Y_i$: i-th digit of a received word Y
$Y = (Y_1, Y_2, \ldots, Y_i, \ldots, Y_N)$
$l_i$: channel measurement information at the time of decoding the i-th digit of the received word Y
$\oplus$: exclusive OR operation
Min: to determine the code word $X_j$ in the set $\Omega_x$ which minimizes the left side of expression (1)
| |: absolute value Now, consider a coding in which "0" and "1" are encoded into "000" and "111", which are respectively represented by $X_1$ and $X_2$, that is, $\Omega_x = \{X_1, X_2\} = \{(000), (111)\}$. In the decoding of each received word Y of three bits, the information "0" or "1" whose number is larger than the other in the 3-bit received word Y is provided as the decoded output. Let it be assumed that the transmitting side has transmitted a code word $X_2 = (111)$ in the form in which "1" and "0" are represented by 1 and −1 [Volt], respectively, and that the receiving side has detected such a waveform 18 as shown in FIG. 2. In FIG. 2, the numerical values in parentheses ( ) represent levels of detected outputs in the decoding of the detected waveform 18 and T indicates the time slot of one bit in the detected waveform 18. In the decoding method in which the level of each digit of the detected waveform 18 is made to correspond to a "1" or "0" depending upon whether the level is positive or negative at the time of decision, the received word Y in the example of FIG. 2 is rendered to Y = (100). In this instance, since the number of "0's" is larger than the number of "1's" the information "0" is regarded to have been transmitted, resulting in erroneous decoding.

In the soft decision decoding using the expression (1), however, $l_1 = 1$, $l_2 = -0.2$, $l_3 = -0.2$, and $Y = (Y_1, Y_2, Y_3) = (100)$. Consequently, for a candidate code word, that is, a reference code word $X_1 = (X_{11}, X_{12}, X_{13}) = (000)$, the left side of expression (1) becomes as follows:

$$\sum_{i=1}^{3} |l_i|(Y_i \oplus X_{1i}) = 1 \cdot (1 \oplus 0) + |-0.2| \cdot (0 \oplus 0) +$$

$$|-0.2| \cdot (0 \oplus 0) = 1.0$$

and for a reference code word $X_2 = (111)$, $$\sum_{i=1}^{3} |l_i|(Y_i \oplus Y_{2i}) = 1 \cdot (1 \oplus 1) + |-0.2| \cdot (0 \oplus 1) +$$

$$|-0.2| \cdot (0 \oplus 1) = 0.4.$$

For the code word $X_2$, the expression (1) is minimum, so the information "1" is regarded to have been transmitted and the received word is correctly decoded.

In this way, according to the soft decision decoding, those of the corresponding digits of the reference code word $X_j$ and the received word Y which differ from each other are each multiplied by a weight corresponding to the reliability of the decision, as a weight coefficient, that is, the level value $l_i$ in this example, and it is regarded that the code word (the reference code word) which minimizes the sum total of multiplied values has been transmitted. This decoding method is characterized in that the reliability information (the level value) obtainable in the bitwise decision of received word is utilized for defining the code distance between the code word and the received word in the process of decoding the error correcting code. This enables the decoding of each bit and the decoding of the error correcting code to be performed integrally, permitting the extension of the error correcting capability.

As described above, the error correcting capability can be increased by utilizing, even in the process of decoding the error correcting code, the level information of FM detection output which is obtainable at the time of decoding each digit (each bit). However, since a non-Gaussian noise such as a click noise appears in the FM detection output, even if the detection level is high, the reliability cannot always be regarded to be high. For this reason, the utilization of the detection output level as the reliability information in the process of decoding the error correcting code does not necessarily provide for increased error correcting capability in terms of accuracy.

Moreover, since the prior art utilizes an analog value of the detection level, it is necessary to convert the detected level to a digital form for digital processing, rendering the entire arrangement complicated accordingly.

SUMMARY OF THE INVENTION

An object of the present invention is to provide a block code decoding method which permits high reliability decoding of error correcting block codes by a relatively simple method through a decoding operation similar to that of the maximum likelihood decoding.

Another object of the present invention is to provide a block code decoding method in which each transmitted block code is received through a plurality of receiving branches and the transmitted block code is decoded on the basis of a plurality of received words through a decoding operation similar to that of the maximum likelihood decoding.

Yet another object of the present invention is to provide a block code decoding method which enables an error correcting block code to be decoded by an operation similar to that of the maximum likelihood decoding, with a relatively simple arrangement for digital processing.

According to a first invention, in a method for decoding a code transmitted as an error correcting code composed by adding redundant bits to information data bits, a received word is produced by bitwise decoding the FM detection output (i.e. demodulation output) bit by bit through hard decision by voltage comparison, and the carrier-to-noise ratio (CN ratio) or receiving electric field level at the decoding of each digit of the received word is detected. All predetermined code words, i.e. all the candidate code words for decoding are each compared with the received word for each digit. Then, the decision results of respective digits at which disagreement or agreement are found are multiplied by weights calculated from the CN ratios or receiving electric field levels corresponding to the digits, the multiplied results for the respective digits are summed up, and one of the candidate code words that gives the smallest or greatest summation is delivered as the decoder output.

Letting the received word be represented by $Y=(Y_1, Y_2, \ldots, Y_N)$, the set of code words X which are candidates for decoding by $\Omega_x$, a j-th one of the candidate code words by $X_j=(X_{j1}, X_{j2}, \ldots, X_{jN})$, and the CN ratios or receiving electric field levels at digits $Y_1, Y_2, \ldots, Y_N$ of the received word by $\gamma_1, \gamma_2, \ldots, \gamma_N$, the code word $X_j$ is selected which satisfies the following condition:

$$\sum_{i=1}^{N} \gamma_i (Y_i \oplus X_{ji}) \rightarrow \underset{X_j \in \Omega_x}{\text{Min}} \quad (2)$$

or $$\sum_{i=1}^{N} \gamma_i (Y_i \overline{\oplus} X_{ji}) \rightarrow \underset{X_j \in \Omega_x}{\text{Max}} \quad (3)$$

where:

Max means the selection of the digit $X_j$ which gives the maximum value of the summation and $\overline{\oplus}$ represents inverted exclusive CR, i.e. $\overline{\text{XOR}}$.

As described above, according to the first invention, by using the CN ratio or receiving electric field $\gamma_i$ as the reliability information $l_i$ in the expression (1), correct maximum likelihood decoding can be achieved without being affected by non-Gaussian noise.

According to second and third inventions, the receiving branches are constituted by space or time diversity, as referred to previously, and in either case, the set of corresponding i-th digits of the respective code words can be regarded as a transmitted word $D_0$ or $D_1$ which has the number M of "1's" or "0's", M being equal to the number of receiving branches. A received word $Z_i=(Z_1, Z_2, \ldots, Z_M)$ composed of M i-th digits is compared digit by digit with the candidate words $$D_0 = (\overbrace{0, 0, \ldots, 0}^{M}) \text{ and } D_1 = (\overbrace{1, 1, \ldots, 1}^{M})$$

which might be transmitted, and either one of the transmitted words $D_0$ and $D_1$ which gives the smallest summation of the CN ratios or receiving electric field levels at the digits which disagree with those of the received word is delivered as the bitwise decision result. Letting the set of transmitted words be represented by $\Omega_D$, the candidate words $D_0$ and $D_1$ by $D_P$ where $\Omega_D = \{D_0, D_1\}$, the corresponding bits in the respective receiving branches by $(D_{p1}, D_{p2}, \ldots, D_{pM})$, the received word (each receiving branch) composed of the i-th digits of code words by $Z_i=(Z_{i1}, Z_{i2}, \ldots, Z_{iM})$, and the CN ratio or receiving electric field intensity at i-th digits in respective receiving branches by $\gamma_i (\gamma_{i1}, \gamma_{i2}, \ldots, \gamma_{iM})$, the received information $Z_i$ of the i-th digits which satisfies the following expression (4) becomes $0=D_0$ or $1=D_1$.

$$\sum_{k=1}^{M} \gamma_{ik} (Z_{ik} \oplus D_{pk}) \rightarrow \underset{D_p \in \Omega_D}{\text{Min}} \quad (4)$$

In the expression (4), an inverted exclusive OR operation (i.e. agreement detection) may also be used in place of the exclusive OR operation (i.e. disagreement detection). In such a case, a word, which gives a maximum to the summation of the left side of expression (4) is delivered as the bitwise decision result.

In the diversity reception, the i-th digit of block code is decoded in the manner described above. Further, when the block code has error correction redundancy, its maximum likelihood decoding is conducted by a third invention, as described below.

Let the thus bitwise decoded received word be represented by $Y=(Y_1, Y_2, \ldots, Y_N)$, the set of code words X which are candidates for decoding by $\Omega_x$, a j-th code word in the set $\Omega_x$ by $X_j$, and respective digits of the code word $X_j$ by $(X_{j1}, X_{j2}, \ldots, X_{jN})$. The value on the left-hand side of the expression (4) is set to $f_i(0)$ on the assumption that the i-th digit of a transmitted word is "0", namely:

$$f_i(0) = \sum_{k=1}^{M} \gamma_{ik} (Z_{ik} \oplus D_{ik}(0)) \quad (5)$$

where $D_{ik}(0)=0$. The value on the left-hand side of the expression (4) is set to $f_i(1)$ on the assumption that the i-th digit of the transmitted word is "1", namely:

$$f_i(1) = \sum_{k=1}^{M} \gamma_{ik} (Z_{ik} \oplus D_{ik}(1)) \quad (6)$$

where $D_{ik}(1)=1$. Then, the following expression is calculated.

$$\sum_{i=1}^{N} |f_i(1) - f_i(0)|(Y_i \oplus X_{ji}) \rightarrow \underset{X_j \in \Omega_x}{\text{Min}} \quad (7)$$

This expression uses $|f_i(1)-f_i(0)|$ as the reliability information in place of $\gamma_i$ in the expression (2). This expression (7) means that when $Y_i \oplus X_{ji}=1$, that is, when a transmission error (disagreement between corresponding bits of the received and candidate words) occurs, the code word $X_j$ which gives a minimum in the summation of $|f_i(0)-f_i(1)|$ for respective error bits is determined to be the result of decoding. Here, $|f_i(0)-f_i(1)|$ is the absolute value of the difference between the summation $f_i(0)$ of the CN ratios or receiving electric field levels $\gamma_k$ in the receiving branches in which a transmitted bit "0" is received as a "1" and the summation $f_i(1)$ of the CN ratios or receiving electric field levels $\gamma_k$ of the receiving branches in which a transmitted bit "1" is received as a "0". This absolute value decreases when the receiving electric field level lowers and bit errors occur at random. Accordingly, the expression (7) means that decoding in which a bit error occurs in spite of a high receiving electric field level is rejected as being abnormal. Furthermore, this absolute value can be construed as information representing the reliability of diversity reception in the bitwise decision of the i-th digit. In this sense, the expression (7) represents the reliability of the diversity reception, and indicates a decoding algorithm, which determines, as the result of decoding, a code word which minimizes the code distance weighted by the above absolute value between the received word and the code word. In the case of quantizing the reliability information, the function F{ } representing the quantization is used, that is, $F\{|f_i(1)-f_i(0)|\}$ is used in place of $|f_i(1)-f_i(0)|$ in the expression (7). The decoding system of the third invention is characterized in that reliability information is obtained through the decoding of each bit in the diversity reception and applied to the decoding of an error correcting code.

According to a fourth invention, in the decoding process in which the i-th digit of a code word is received by M receiving branches according to the second invention, all the reliability information $\gamma_{ik}$ is set to "1", and the decoding based on the majority logic is performed. That is, $$\sum_{k=1}^{M} (Z_{ik} \oplus D_{pk}) \to \underset{D_p \epsilon \Omega_D}{\text{Min}} \quad (8)$$

Next, in the decoding of the block code, as in the third invention, the absolute value of the difference in the results of the summations by the expression (8) is used as the reliability information $J_i$ of the i-th digit; namely, $$J_i = \left| \sum_{k=1}^{M} Z_{ik} \oplus Z_{0k} - \sum_{k=1}^{M} Z_{ik} \oplus Z_{1k} \right| \quad (9)$$

and, as is the first invention, the decoding is carried out by:

$$\sum_{i=1}^{N} J_i (Y_i \oplus X_{ji}) \to \underset{X_j \epsilon \Omega_x}{\text{Min}} \quad (10)$$

This decoding method also increases the error correcting capability because the reliability information obtained through the bitwise decision in the diversity reception is utilized in the block decoding process. Moreover, this decoding method digitalizes the entire processing, and hence permits simplification of the arrangement used.

According to a fifth invention, the difference in the time occupancy ratio between "high" and "low" levels of the detected output is obtained for each bit through use of a voltage comparator, and is employed as reliability information for decoding. For instance, the detected waveform, that is, the demodulated waveform corresponding to each bit is compared to a reference voltage and the compared output is divided at several points on the time axis, and $+1$ and $-1$ are made to correspond to the "mark" (positive level) and "space" (negative level) of each divided output. The difference between the numbers of "marks" and "spaces", that is, the difference in the time occupancy ratio per regenerated bit between the "mark" and "space", or a value proportional to the difference, is used as information representing the reliability of the bitwise decoding. And the soft decision decoding of each received word (frame) is conducted using this reliability information in place of the level value $l_i$ employed in the conventional soft decision decoding. With this method, the capability of the error correcting code can be improved more than in the case of the conventional hard decision decoding, to substantially the same extent as by the traditional soft decision decoding. In addition, decoding can be achieved by simple processing without involving complicated processing such as an analog-to-digital conversion.

The foregoing description has been given mainly in connection with the case where such a code word is decided to be the transmitted code word that gives a minimum in the sum of the reliability information values of the digits at which the received word Y and the candidate code word $X_j$ disagree with each other. It is also possible, however, to decide the code word that gives a maximum in the sum of the reliability information values of the digits at which the received word Y and the candidate code word $X_j$ agree with each other, as mentioned previously.

As will be appreciated from the above, according to any of the present inventions, errors which are uncorrectable by the prior art can be corrected through a decoding operation similar to the maximum likelihood decoding which utilizes the conventional soft decision decoding. Furthermore, in the case of applying these inventions to mobile digital communication, the receiving electric field level which is always measured for the detection of the radio zone concerned in general mobile radio station can be utilized as the reliability information. Namely, no particular hardware is needed for obtaining the reliability information. Moreover, the time or space diversity system has been generally employed in the mobile communication, and so it can be utilized for the inventions. In addition, conventional algorithms for soft decision decoding, for example, the afore-mentioned Chase's algorithms can be employed with no modifications.

BRIEF DESCRIPTION OF THE DRAWINGS

FIGS. 20A through 20G are diagrams showing the relationships of various detected waveforms and their voltage comparator outputs relative to a transmitted waveform, for explaining the difference in time occupancy ratio which is used in the fifth invention;

FIG. 25 is a graph of word error probability vs. average carrier-to-noise ratios.

DESCRIPTION OF THE PREFERRED EMBODIMENTS

First Invention

Figure 3:
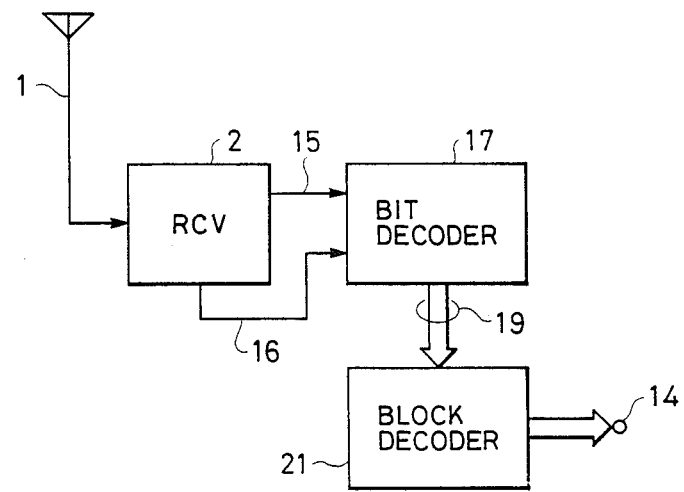
FIG. 3 is a block diagram illustrating an example of a receiving unit embodying the third invention.

FIG. 3 illustrates an embodiment of a first invention. A receiving antenna 1 is connected to a receiver 2, from which are provided an FM demodulated output 15 and a detected receiving electric field level output 16. These outputs 15 and 16 are both applied to a bit decoder 17, in which the output 15 is decoded bit by bit and the receiving electric field level at the timing of bit decoding is sampled, and from which a received word of one frame (one block code) and the sample values are provided as an output 19 to a block decoder 21. The block decoder 21 performs processing for selecting from all or some of prestored code words a candidate code word which will minimize the summation of sample values of the receiving electric field levels at those digits of the received word which disagree with the corresponding digits of the candidate code word, or the summation of receiving CNR (Carrier-to-Noise Ratio) values which are obtainable from the above sample values. The result of this processing is provided as a decoded output to a terminal 14.

Next, a description will be given of the decoding operation. As is well-known in the art, in mobile communication the receiving electric field level undergoes substantial variations; in this embodiment, the receiving electric field level at the time of bitwise decision is provided as the receiving electric field level output 16 from the receiver 2. Letting the receiving electric field level be represented by R, the bit error probability $P_E(\gamma)$ is expressed as follows:

$$P_E(\gamma) = \tfrac{1}{2} e^{-\alpha\gamma} \tag{9}$$

where $\gamma = R^2/(2N)$ (which is the receiving CNR value, N being the noise power of the receiver) and $\alpha$ is a constant. By calculating the posterior probabilities of all the code words at the time of having received a word Y, using $P_E(\gamma_i)$ as an estimate of the bit error probability for an i-th digit of the received code word, a word which is the most likely to have been transmitted can be obtained; namely, the maximum likelihood decoding can be achieved.

Since the bit error probability by the expression (9) abruptly decreases with an increase in the receiving CN ratio $\gamma$, the maximum value of the posterior probability is nearly equal to the product of bit error probabilities of error bits found by algebraic decoding, i.e. minimum distance decoding. However, since the bit error probability by the expression (9) is given in the form of an exponential function, the determination of a code word which will maximize the posterior probability is equivalent to finding a code word which will minimize the summation of the receiving CN ratios at those digits of the code word which disagree with the corresponding digits of the received word. Furthermore, it is equivalent as well to finding a code word which will minimize the summation of the receiving electric field levels for the digits where the received word and the code word disagree with each other, because the receiving electric field level R is greater than or equal to zero. The summation of an arbitrary weight W(R) which is defined by monotonic increasing function of receiving electric field level may also be utilized.

The block decoder 21 executes the above-described decoding algorithm. It is formulated by:

$$\sum_{i=1}^{N} \gamma_i (Y_i \oplus X_{ji}) \to \operatorname*{Min}_{X_j \in \Omega_x} \tag{10}$$

where $Y=(Y_1, \ldots, Y_N)$, i.e. a received word, $\Omega_x$ is the whole set of code words X, $X_j=(X_{j1}, \ldots, X_{jN})$, i.e. a j-th code word in the set $\Omega_x$, and $\gamma_i$ is the receiving CN ratio at the time of deciding the i-th digit $Y_i$. By the above decoding algorithm the code word $X_j$ is determined for which the value on the left-hand side of the above expression (10) is minimum.

The above indicates that the decoding method of this invention permits an operation similar to that of the maximum likelihood decoding and improves the word error probability characteristic. However, the above decoding method necessitates the calculation of the expression (10) for each of the code words in the set $\Omega_x$ in order to select therefrom a code word which provides the minimum value on the left-hand side of the expression (10), and accordingly, the above method will involve an enormous computational quantity when the number of code words is large. In the above, it is assumed that every code word in the set can be a candidate of the decoding result, and this leads to the above-mentioned defect. But the overall computational quantity involved can be reduced by decreasing the number of such code words through utilization of the following algorithm, for instance.

(1) Of the digits of the received word Y, K bits are selected in an ascending order of the receiving CNR value $\gamma_i$ from the smallest, where $0 < K \leq 2d$ with respect to the code distance $2d+1$ of the code word X. Incidentally, when $K=0$, this algorithm is equivalent to the minimum distance decoding, and when $K=N$, this algorithm is equivalent to the above-described one which performs processing for all the code words.

(2) In this instance, the K bits are assumed to have been erased in reception, and C-bit error correction decoding (where $0 < C \leq d$) is performed by the algebraic decoding (i.e. minimum distance decoding)

method applying $2^K$ kinds of patterns to the erased portion, thus obtaining $2^K$ code words.

(3) From a set $\Omega_x'$ (where $\Omega_x' \epsilon \Omega_x$) of the $2^K$ code words determined for the respective patterns in (2), a code word $X_j$ is selected which satisfies the following expression:

$$\sum_{i=1}^{N} \gamma_i (Y_i \oplus X_{ji}) \rightarrow \underset{X_j \epsilon \Omega'_x}{\text{Min}} \quad (10')$$

That is, the code word $X_j$ thus determined is regarded as the transmitted word $X_j$, i.e. the final result of decoding.

With this algorithm, it is necessary only to perform a maximum of $2^K$ algebraic decoding operations and calculate the left-hand side of the expression (10') for $2^K$ code words (less than $2^N$) obtained by the algebraic decoding.

Figure 4:
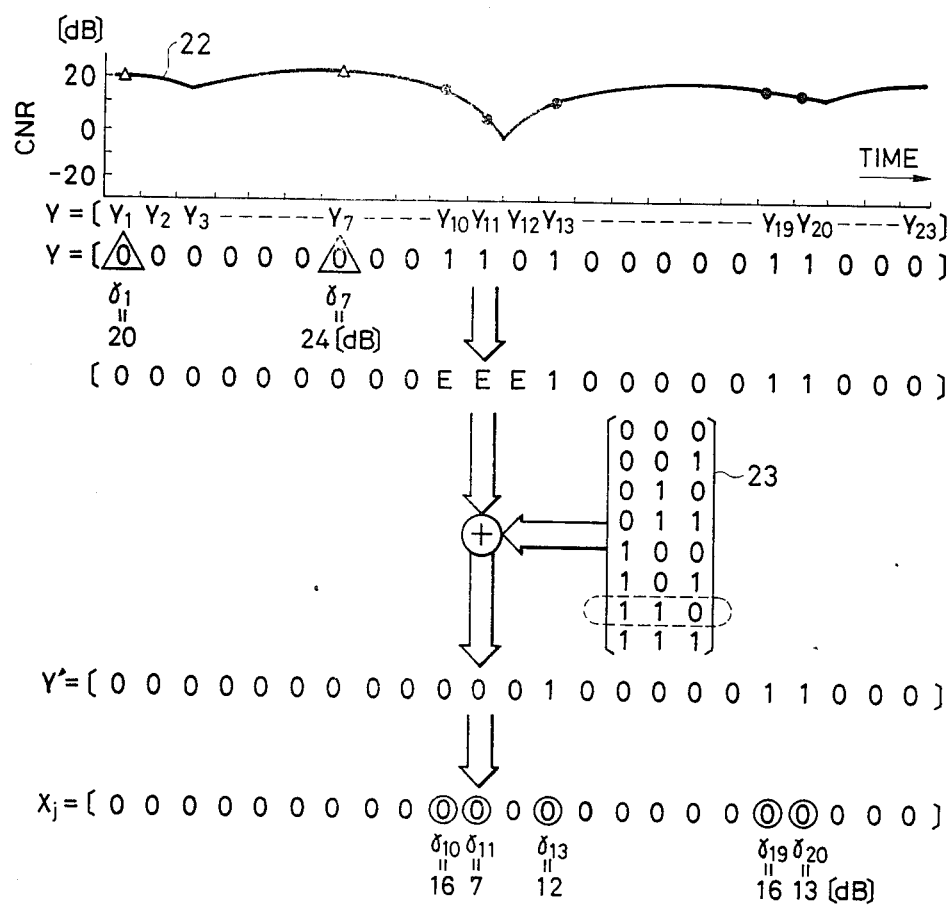
FIG. 4 is a diagram concretely showing the principle of decoding by the first invention.

Referring now to FIG. 4, the principle of this decoding will be described in concrete terms.

Now, let it be assumed, for example, that a code $X_j$ having a code length $N=23$ and a code distance $2d+1=7$ has been transmitted with its all digits "0's". Assume that at the receiving side, the receiving CNR at the time of having received this frame (one word) undergoes such variations as indicated by the curve 22 in FIG. 4 and the received word Y is such as follows:

$$Y = [Y_1 Y_2 \ldots Y_{23}]$$
$$= [00000000011010000011000]$$

In this example, the received word Y has errors at five bits $Y_{10}$, $Y_{11}$, $Y_{13}$, $Y_{19}$ and $Y_{20}$. According to the conventional algebraic decoding, this will result in erroneous decoding (by the algebraic decoding, this code has error correcting capability for up to $d=3$ bit errors.) and the transmitted word is decoded to a word having two error bits compared with a code word closest to the transmitted word. Assume that the two error bits are specified at the positions of, for instance, the first and seventh digits $Y_1$ and $Y_7$, as indicated by triangles in FIG. 4. That is, the code word closest to the transmitted word is $X_{j+1}=[10000010011010000011000]$. The receiving CNR values at the two bits are such as shown in FIG. 4, in which $\gamma_1$ is 20 and $\gamma_7$ is 24 [dB].

The erasure bit number K may be within the range of $0 \leq K \leq 2d=6$. In this example, three bits are selected, as the erasure bits, which correspond to the lowest three receiving CNR values, and they are the 10th, 11th and 12th digits $Y_{10}$, $Y_{11}$ and $Y_{12}$, which are identified by E in FIG. 4. (In these digits are included the error bits $Y_{10}$ and $Y_{11}$.)

Next, $2^3$ different 3-bit patterns are each substituted to the three erasure bits. In a practical arrangement, $2^3$ 3-bit patterns are generated, each of which is EXCLUSIVE ORed with the 3-bit portion on a bitwise basis. When the resultant three bits are (000), that is, when the generated pattern is (110), the received word becomes $Y' = [00000000000010000011000]$. In this case, error bits in the word Y', relative to the transmitted word, are those three at digits $Y_{13}$, $Y_{19}$, and $Y_{20}$, which are equal to or less than d ($=3$) and therefore can be corrected to the same pattern as the transmitted code word $X_j$ whose digits are all zeros.

At the receiving side, however, it is unknown at this stage whether the pattern with all the digits being zeros is the transmitted word or not. When it is assumed that the transmitted word has the pattern whose digits are all zeros, the actual error bits in the received word Y are those altered from "0s" to "1s", and so they are the 10th, 11th, 13th, 19th and 20th digits. The receiving CNR values at these digits are as follows: $\gamma_{10}=16$, $\gamma_{11}=7$, $\gamma_{13}=12$, $\gamma_{19}=16$, and $\gamma_{20}=13$ [dB].

Next, comparison is made between the sum of the receiving CNR values at the error bits (disagreed digits) in the received word Y when the received word Y is assumed to have been decoded to the code word $X_{j+1}$ closest to the transmitted word $X_j$ and the sum of the receiving CNR values at error bits in the received word Y when the received word Y has been decoded to a code whose digits are all zeros. As a result of this, $\gamma_1 + \gamma_7 = 351$ [true value] for the former and $\gamma_{10} + \gamma_{11} + \gamma_{13} + \gamma_{19} + \gamma_{20} = 121$ [true value] for the latter. (In this instance, the receiving CNR values expressed in decibel are calculated in terms of true values.) Accordingly, since the sum of the receiving CNR values at the error bits is smaller in the latter case than in the former, it is decided that the transmitted word is a code whose digits are all zeros, and it is decoded correctly. In other words, $2^K$ codes which are closest to respective $2^K$ words obtainable by replacing the K erasure bits in the received word Y with $2^K$ different K-bit patterns, are selected and the sum total of the receiving CNR values corresponding to error bits between the received word Y and each of the selected $2^K$ closest codes is calculated, and one of the selected codes which gives the smallest sum of the receiving CNR value is decided to have been transmitted.

Figure 5:
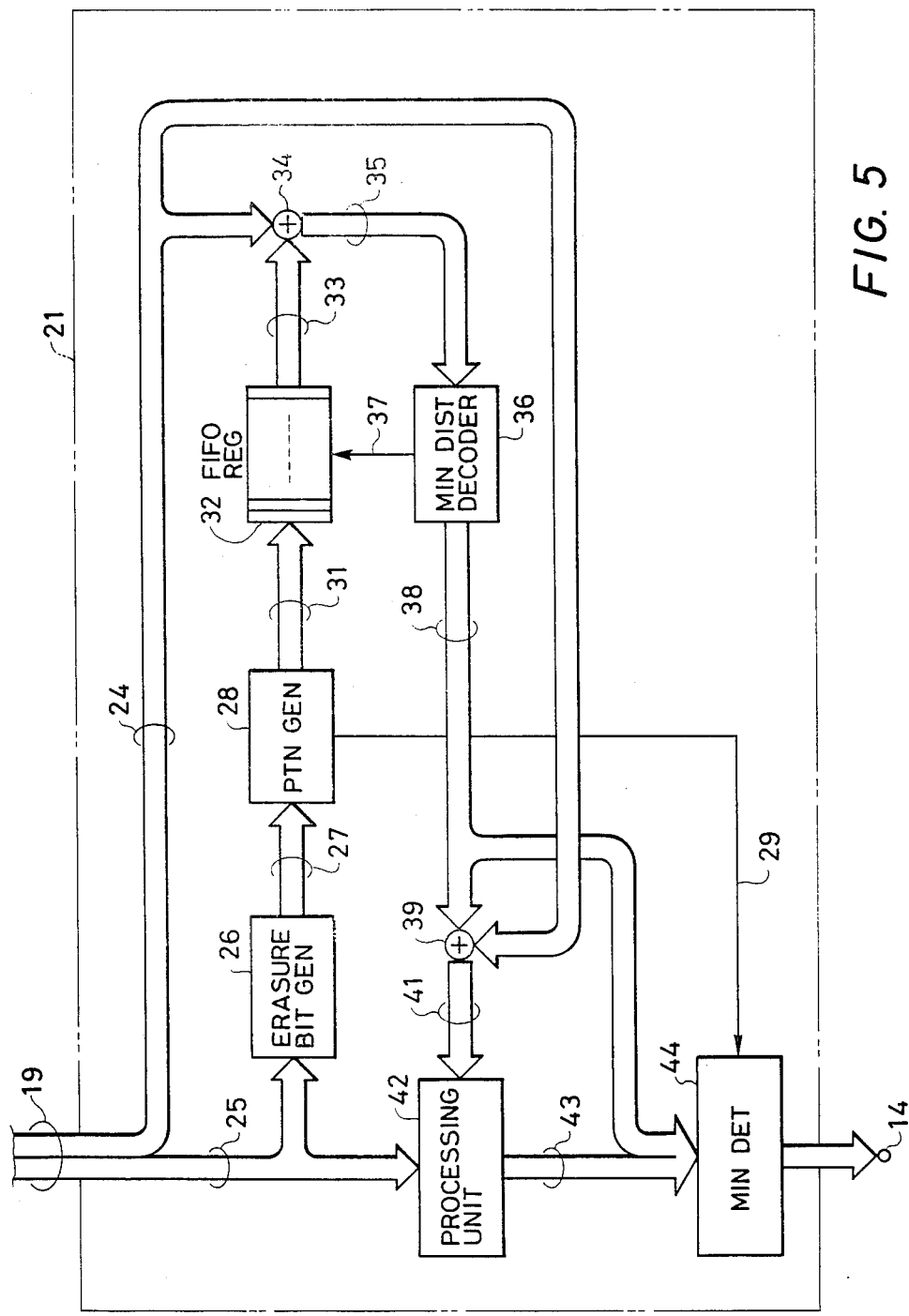
FIG. 5 is a block diagram showing a specific example of a block decoder 21 in FIG. 3.

The decoding algorithm described above is executed, for example, by the block decoder 21 shown in FIG. 5. In FIG. 5, the bit decoder output 19 includes a received word 24 of one frame and sample values 25 of the receiving electric field levels at respective digits of the received word. The sample values 25 are supplied to an erasure bit generator 26, wherein a predetermined number (K) of bits are selected, as erasure bits (erasure digits), in an ascending order of receiving level from the smallest level in one frame. The erasure bit generator 26 supplies a pattern generator 28 with data 27 indicating the positions of the erasure bits in one frame. The pattern generator 28 applies all patterns ($2^K$ different patterns) to the positions of the erasure bits and outputs all the patterns in a sequential order, thereafter producing a pattern end pulse 29. The pattern outputs 31 from the pattern generator 28 are stored in a first-in first-out (FIFO) register 32. The erasure bits 33 output from the FIFO register 32 and the corresponding bits of the received word 24 are EXCLUSIVE ORed with each other by an exclusive OR circuit 34. The output 35 from the exclusive OR circuit 34 is subjected to minimum distance decoding by a minimum distance decoder 36, which applies a read pulse 37 to the FIFO register 32 upon completion of the decoding operation for each exclusive ORed output 35.

The results of the minimum distance decoding 38 i.e. the closest codes from the minimum distance decoder 36 are provided to an exclusive OR circuit 39, wherein each of the closest codes is EXCLUSIVE ORed with the received word 24 to find disagreements between corresponding bits, generating a pattern 41 in which each bit where disagreement is detected between them goes to "1" (or high). The patterns 41 are input in a processing unit 42, which calculates the sum or sum square of the sample values 25 of the receiving electric field levels corresponding to the "high" digits in each one of the patterns 41. The calculated sums 43 are applied to a minimum detecting circuit 44, wherein the sum values 43 and the corresponding closest codes 38 are successively stored until the application of the pattern end pulse 29. Then, the minimum detecting circuit 44 detects the smallest one of the sums and outputs a corresponding one of the closest codes as a decoded transmitted word.

The erasure bit generator 26 performs the step (1) of the afore-mentioned algorithm. The pattern generator 8, the FIFO register 32, the exclusive OR circuit 34, and the minimum distance decoder 36 perform the step (2) of the algorithm. The exclusive OR circuit 39 and the processing unit 42 perform the calculation of the value on the left-hand side of the expression (10'), and the minimum detecting circuit 44 performs an operation of detecting the smallest value of the expression (10').

Figure 6:
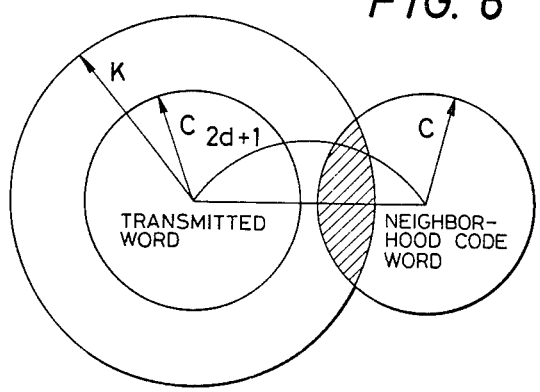
FIG. 6 is a diagram showing the relation between the number of erasure bits, the number of error correcting bits, and the area, of decoding.

Next, a description will be given of the effect of improving the word error probability characteristics by this first invention. As depicted in FIG. 6, the area of decoding is divided into two classes according to the values of the erasure bit number K and the error correcting bit number C.

(i) When the error correction bit number C is $$C \leq [(2d-K)/2] \quad (11)$$

with respect to the code distance $2d + 1$ where [ ] denotes Gauss' notation, the received word can be decoded to a single code word. Accordingly, this code word satisfies the condition for minimizing the expression (10'). Thus calculation of the expression (10) is not required.

(ii) When $C > [(2d-K)/2]$, the set $\Omega$ includes a plurality of code words. Accordingly, the code word which minimizes the expression (10') cannot be obtained unless the left-hand side of the expression (10) is calculated for all the code words.

Now, the above-mentioned characteristic improving effect will be demonstrated quantitatively for each of the cases (i) and (ii).

In the case (i):

The probability density of the receiving CNR values for $(N-K)$ bits which are not erasure bits is given by:

$$P_c(\gamma) = \frac{N}{N-K} P(\gamma) \cdot \sum_{m=1}^{N-K} {}_{N-1}C_{K+m-1} P(\gamma)^{K+m-1} \quad (12)$$

$$\{1 - P(\gamma)\}^{N-K-m}$$

$$P(\gamma) = \frac{1}{\Gamma} e^{-\gamma/\Gamma},$$

wherein $\Gamma$ is the average CNR value and $$P(\gamma) = \int_0^\gamma P(\gamma')d\gamma' \quad .$$

Figure 7:
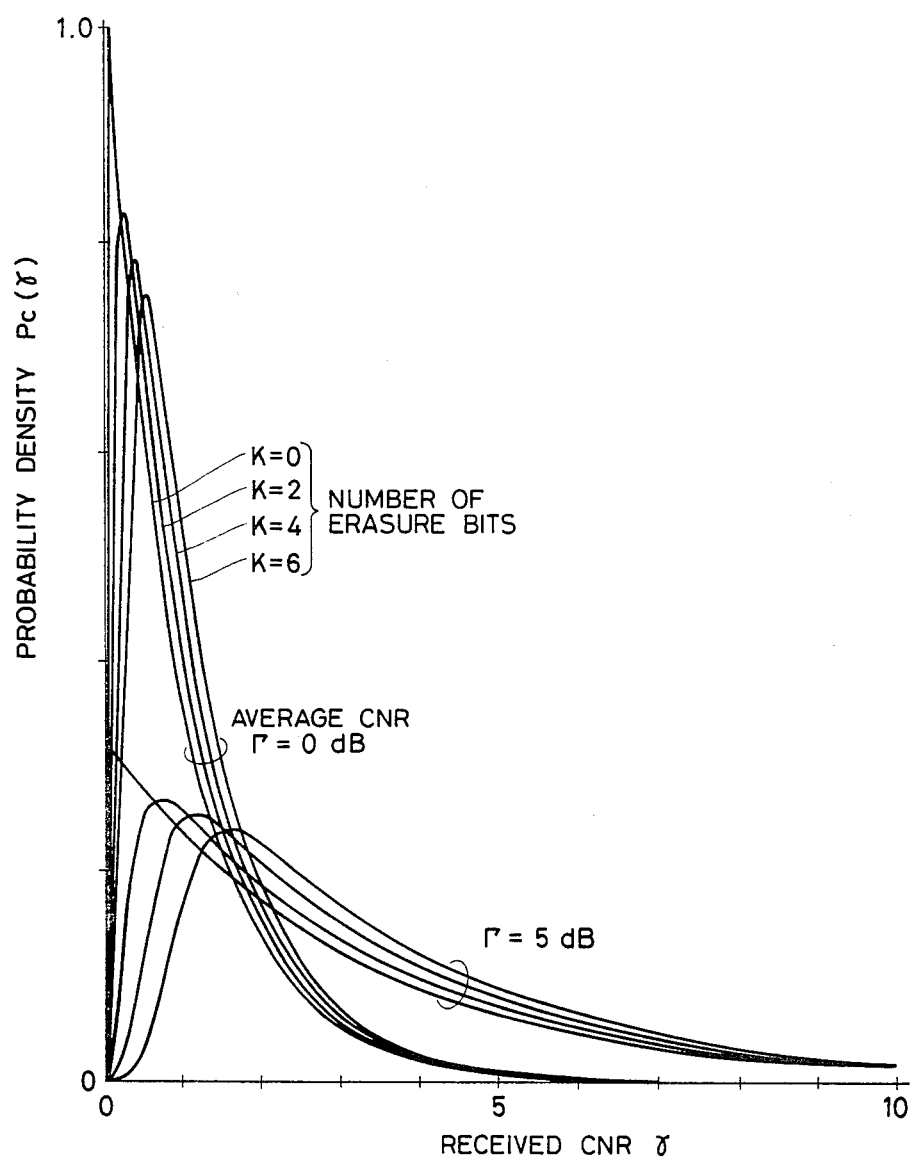
FIG. 7 is a graph showing a probability density function of the receiving CN ratio of non-erasure (N - K) bits.
Figure 8:
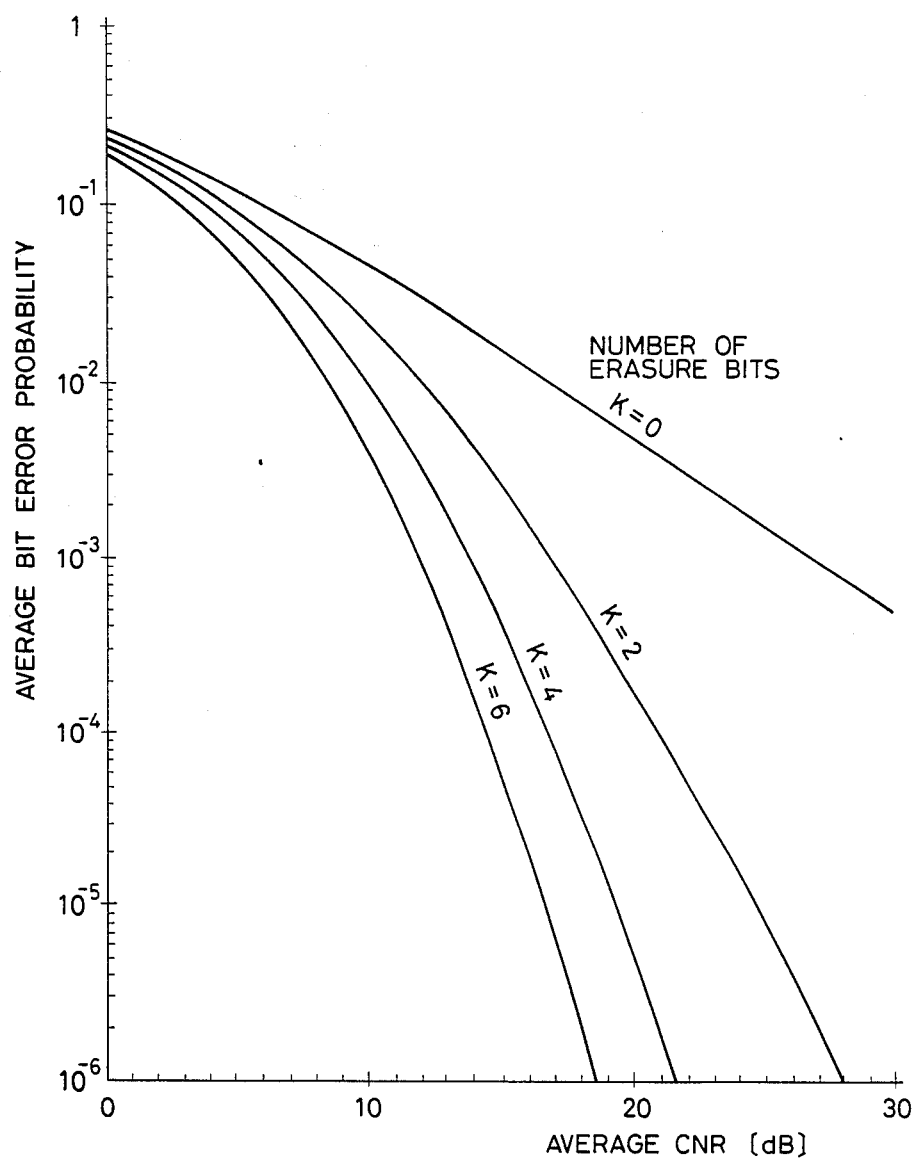
FIG. 8 is a diagram showing the average bit error probability of the non-erasure (N - K) bits.

FIG. 7 shows the probability density $P_c(\gamma)$ for $N=23$. As is evident from FIG. 7, as the erasure bit number K increases, the peak of a probability density function moves to the right, producing the diversity effect. The average bit error probability in the $(N-K)$ bits can be obtained by averaging the bit error probabilities of the expression (9) with the probability density function of the expression (12), which is shown in FIG. 8. As is seen from FIG. 8, the larger the erasure bit number K is, the more the average error probability is improved.

Yet, since an increase in the erasure bit number K decreases the equivalent code distance, the error correcting capability is impaired; and so the overall word error probability cannot always be raised.

Next, reference will be made to the word error probability. When the number of errors in the $(N-K)$ bits which are not erasure bits is smaller than the error correcting bit number C, the received word is decoded correctly. When the number of error bits is $C+1$ or more, the received word is not decoded correctly. Assuming random error, the word error probability is given by:

$$P_{w1} = 1 - \sum_{i=0}^{C} {}_{N-K}C_i P_{bi}{}^i (1 - P_{b1})^{N-K-i} \quad (13)$$

where $P_{b1}$ is the average bit error probability in FIG. 8.

Figure 9:
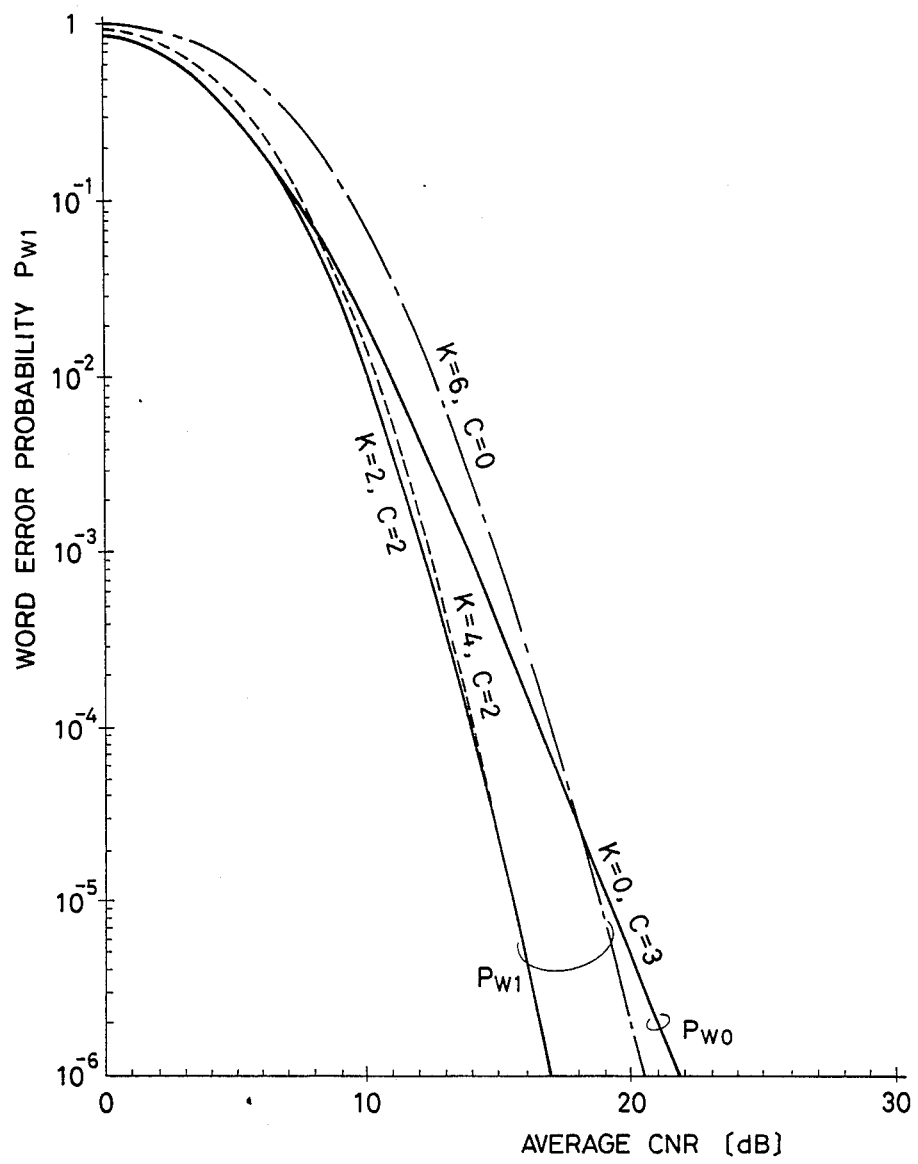
FIG. 9 is a graph showing logical values of a word error probability characteristic in a case (i)

FIG. 9 shows the relationships between the average CNR value obtained from the expression (13) and the word error probability $P_{w1}$. As is evident from FIG. 9, when the erasure bit number K and the error correcting bit number C are both two, the characteristic improving effect is maximum, and the receiving CNR value required for obtaining a word error probability $=10^{-3}$ is about 2 dB smaller than in the case where the erasure bit number K is zero and the error correcting bit number C is three as indicated by $P_{w0}$. In this case, no bits are regarded as erasure bits and the 3-bit error correction is carried out.

In the case (ii):

The word error probability $P_{w2}$ in this instance is expressed as follows:

$$P_{w2} = P_w' + P_w'' \quad (14)$$

where:

$P_w' = P_{rob}$ (C+1 or more errors occur in the $(N-K)$ bits which are not regarded as erasure bits.)

$P_w'' = P_{rob}$ (The number of errors in the $(N-K)$ bits which are not regarded as erasure bits is C or less, but the erroneous code word is decoded as a result of the minimization of the expression (10').)

When the errors are random, $P_w'$ is obtained, as is the case with the afore-mentioned $P_{w1}$, by the following expression (15):

$$P_w' = 1 - \sum_{i=0}^{C} {}_{N-K}C_i P_{b1}{}^i (1 - P_{b1})^{N-K-i} \quad (15)$$

On the other hand, when the errors are random, $P_w''$ is given by the following expression (16):

$$P_w'' = \sum_{K=0}^{K} \sum_{l=d+1-c}^{C} {}_KC_K \cdot {}_{N-K}C_l \cdot P_w^{Kl} \quad (16)$$

where:

$$P_w^{Kl} = P_{c0}^{Kl} \cdot \int_0^\infty \int_{\gamma_0}^\infty P_1(\gamma) P_2(\gamma_0) \, d\gamma d\gamma_0$$

$$P_1(\gamma) = \int_0^\infty F_{cc}(u)^k \cdot F_{cc}(u)^l e^{\gamma u} du$$

-continued $$P_2(\gamma_0) = \int_0^\infty F_{en}(u)^s F_{cn}(u)^t e^{\gamma_0 u} du$$

$$S = K - k, \quad t = e - K + k, \quad e = 2d + 1 - k - l$$

$$F_{ee}(u) = \int_0^\infty q_{ee}(\gamma) e^{-\gamma u} d\gamma$$

$$F_{ce}(u) = \int_0^\infty q_{ce}(\gamma) e^{-\gamma u} d\gamma$$

$$F_{en}(u) = \int_0^\infty q_{en}(\gamma) e^{-\gamma u} d\gamma$$

$$F_{cn}(u) = \int_0^\infty q_{cn}(\gamma) e^{-\gamma u} d\gamma$$

$$q_{ee}(\gamma) = \tfrac{1}{2} e^{-\alpha\gamma} \cdot P_e(\gamma)/P_{b2}$$

$$q_{ce}(\gamma) = \tfrac{1}{2} e^{-\alpha\gamma} \cdot P_c(\gamma)/P_{b1}$$

$$q_{en}(\gamma) = \left(1 - \tfrac{1}{2} e^{-\alpha\gamma}\right) \cdot P_e(\gamma)/(1 - P_{b2})$$

$$q_{cn}(\gamma) = \left(1 - \tfrac{1}{2} e^{-\alpha\gamma}\right) \cdot P_c(\gamma)/(1 - P_{b1})$$

$$P_{b1} = \int_0^\infty \tfrac{1}{2} e^{-\alpha\gamma} \cdot P_e(\gamma) d\gamma$$

$$P_{b2} = \int_0^\infty \tfrac{1}{2} e^{-\alpha\gamma} \cdot P_c(\gamma) d\gamma$$

$P_c(\gamma)$ is given by the expression (12), and $P_e(\gamma)$ is as follows:

$$P_e(\gamma) = \tfrac{K}{M} P(\gamma) \cdot$$

$$\sum_{m=1}^{K} {}_{N-1}C_{N-K+m-1}\{1 - P(\gamma)\}^{N-K+m-1} \cdot P(\gamma)^{K-m}.$$

$P_{e0}{}^{kl}$ is as follows:

$$P_{e0}{}^{kl} = {}_KC_k \cdot {}_{N-K-1}C_l \cdot P_{b2}{}^k \cdot (1-P_{b2})^{K-k} \cdot P_{b1}{}^l \cdot (1-P_{b1}).$$

Figure 10:
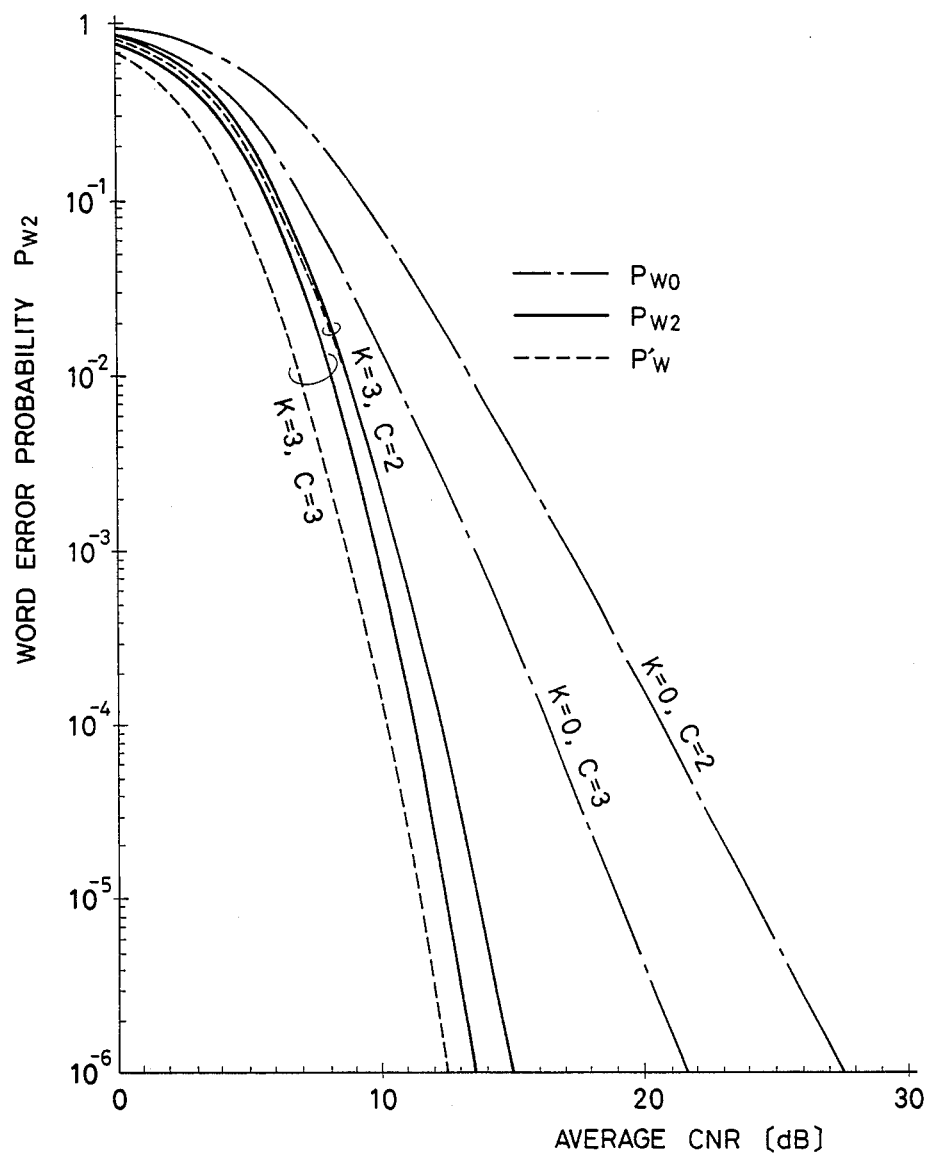
FIG. 10 is a graph showing logical values of the word error probability characteristic in a case (ii)

FIG. 10 shows the relationships between the word error probability $P_{w2}$ and the average receiving CNR value in the case where N=23 and 2d+1=7 (the Golay code). Calculation results are shown for the cases where the erasure bit number K=3 and the error correcting bit number C=3 and where K=3 and C=2. In FIG. 10 there are also shown the word error probability $P_{w0}$ for the cases where K=0 and C=3 and where K=0 and C=2, each case obtained by the error correction alone, and also shown is $P_w'$ which represents the probability that the number of errors in the (N−K) bits which are not regarded as erasure bits is C+1 or more. FIG. 10 reveals the following facts:

(1) When K=3 and C=3, the word error probability $P_{w2}$ is deteriorated more than $P_w'$, but when K=3 and C=2, the former is substantially equal to the latter.

(2) When K=3 and C=3, the word error probability $P_{w2}$ presents a better characteristic than in the case where K=3 and C=2, but the difference is very slight. In terms of the average receiving CNR value for obtaining a word error probability $10^{-3}$, they are improved about 4 dB as compared with those in the case of performing the 3-bit error correction alone.

Verification By Computer Simulation

The theoretical values mentioned in the above were obtained on the assumption that the errors are random, but when the CNR $\gamma_i$ is correlated each other, it is difficult to obtain the joint probability density of the receiving CNR values for bits in the erasure and non-erasure portions. Then, the word error probability characteristics in the cases (i) and (ii) were obtained by computer simulation. The procedures used for simulation are as follows:

(1) Amplitude variations corresponding to Rayleigh fading are generated.

(2) The receiving CNR $\gamma_i$ is calculated from the amplitude value at an i-th digit (bit) and the bit error probability is calculated by $P_{bi} = \tfrac{1}{2}\exp(-\gamma_i)$.

(3) Random numbers in a section (0, 1) are produced, and when an i-th value $X_i$ is smaller than $P_{bi}$, the i-th digit is regarded as being erroneous.

(4) The steps (1) through (3) are repeated. The amplitude value is sampled with a normalized sampling period corresponding to $f_D T$ where $f_D$ is the fading pitch, T=1/fb, fb being the bit rate.

Figure 11A:
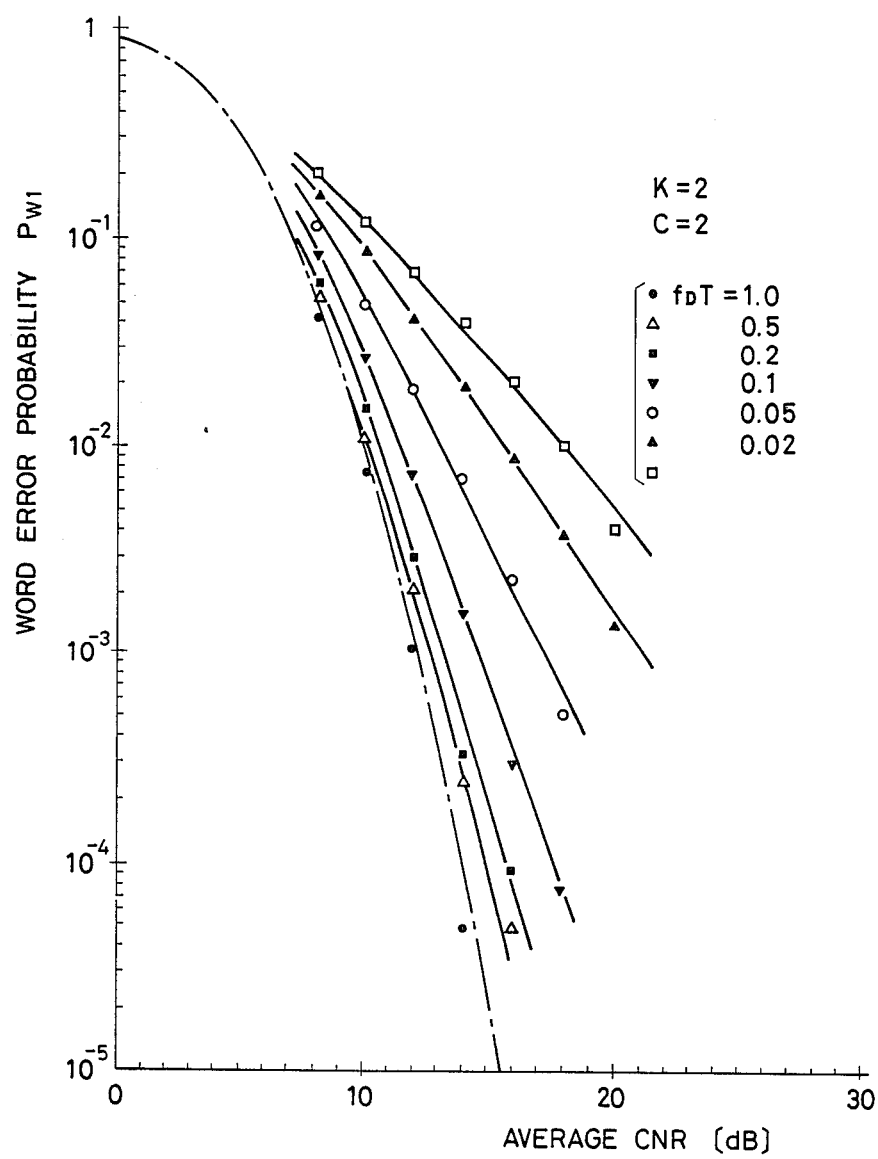
FIGS. 11A through 11C are graphs showing the results of simulation of the word error probability characteristics in the cases (i) and (ii)
Figure 11B:
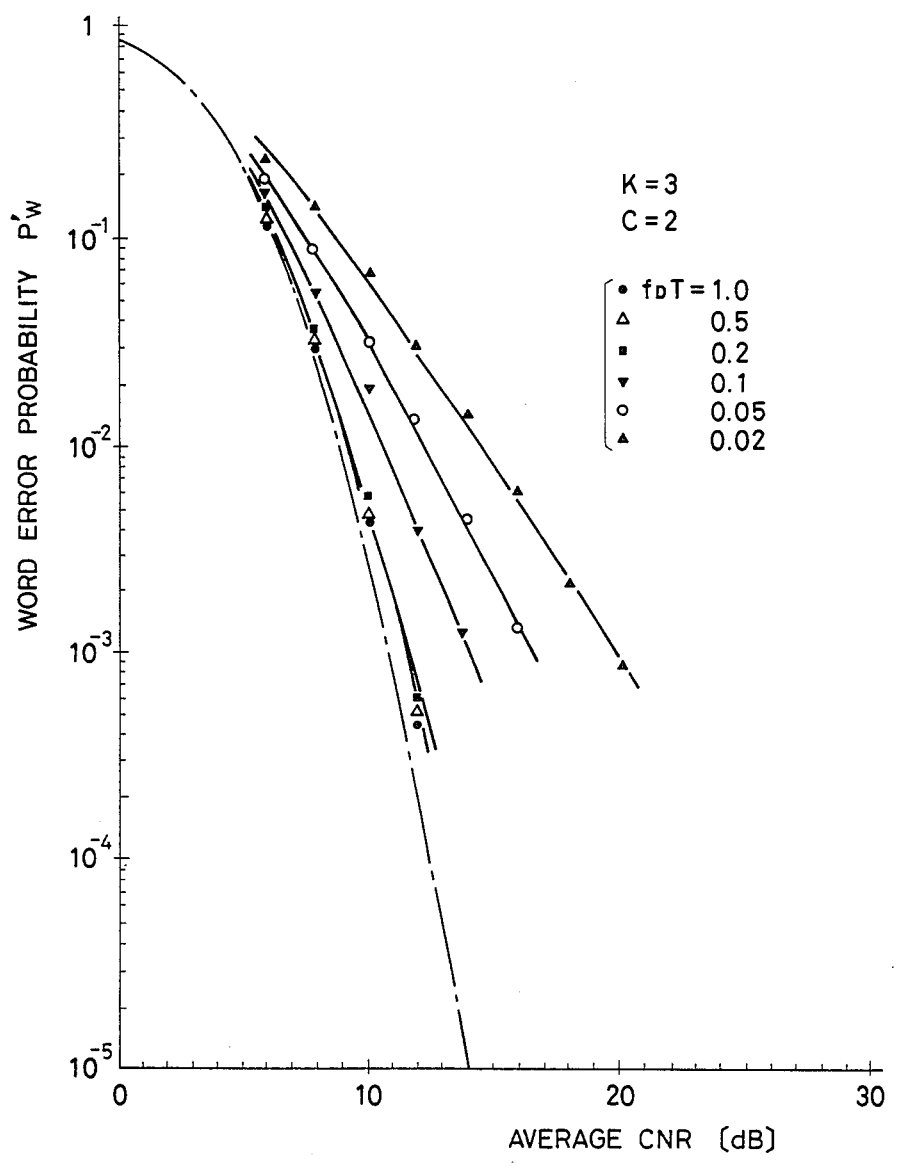
Figure 11C:
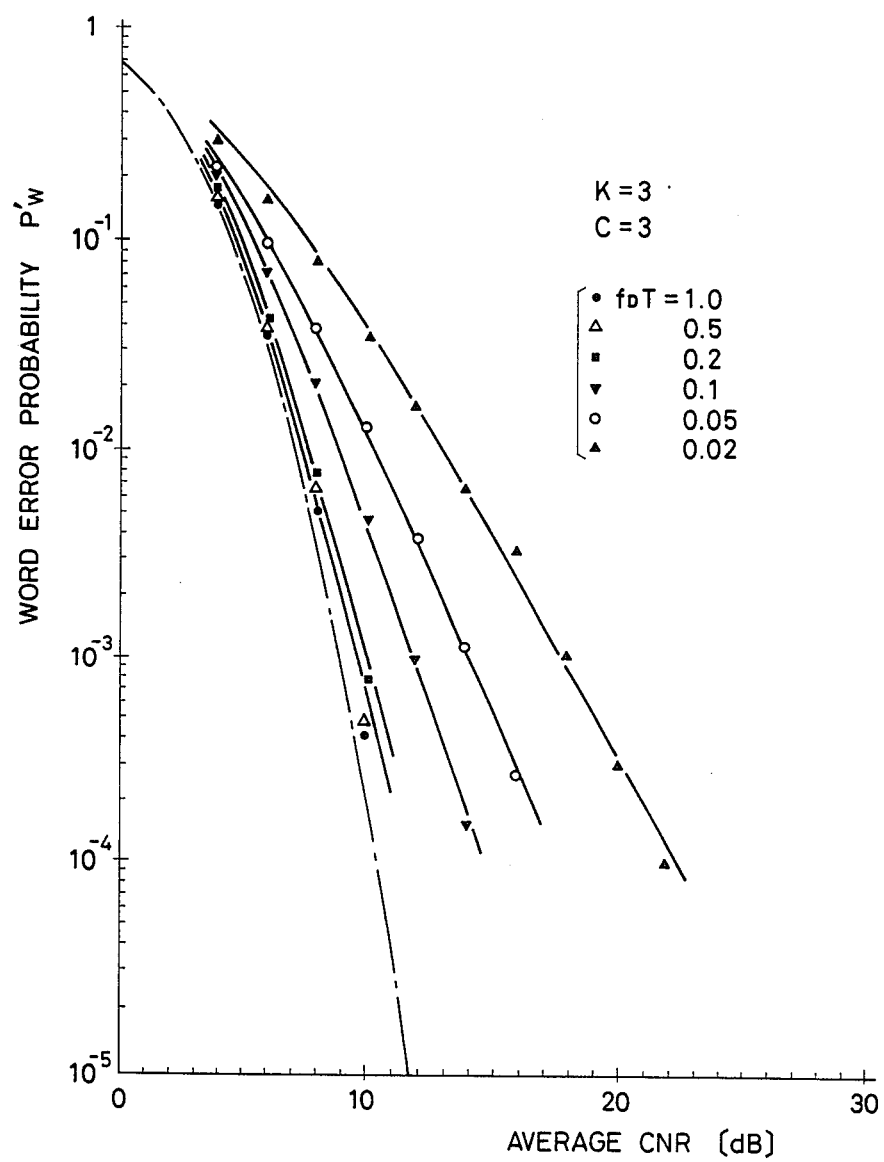

The results of simulation are shown in FIGS. 11A, 11B and 11C. FIG. 11A shows the results of simulation for $P_{w1}$ in the case (i), with parameters K=2 and C=2, and FIGS. 11B and 11C the results of simulation for $P_w'$ (the probability of C+1 or more errors occurring in the (N−K) bits regarded as non-erasure bits), with parameters K=3 and C=2 in FIG. 11B and K=3 and C=3 in FIG. 11C. The following facts can be deduced from FIGS. 11A, 11B and 11C:

(1) When errors can be regarded as being random (i.e. when $f_D T = 1$), any results of simulation are in agreement with the afore-mentioned theoretical values.

(2) In either of the cases (i) and (ii), the word error probability characteristic becomes degraded as $f_D T$ increases, but in the case (ii) the rate of degradation is not so large when $f_D T$ is 0.5 and 0.2, and thereafter it abruptly drops.

Figure 12:
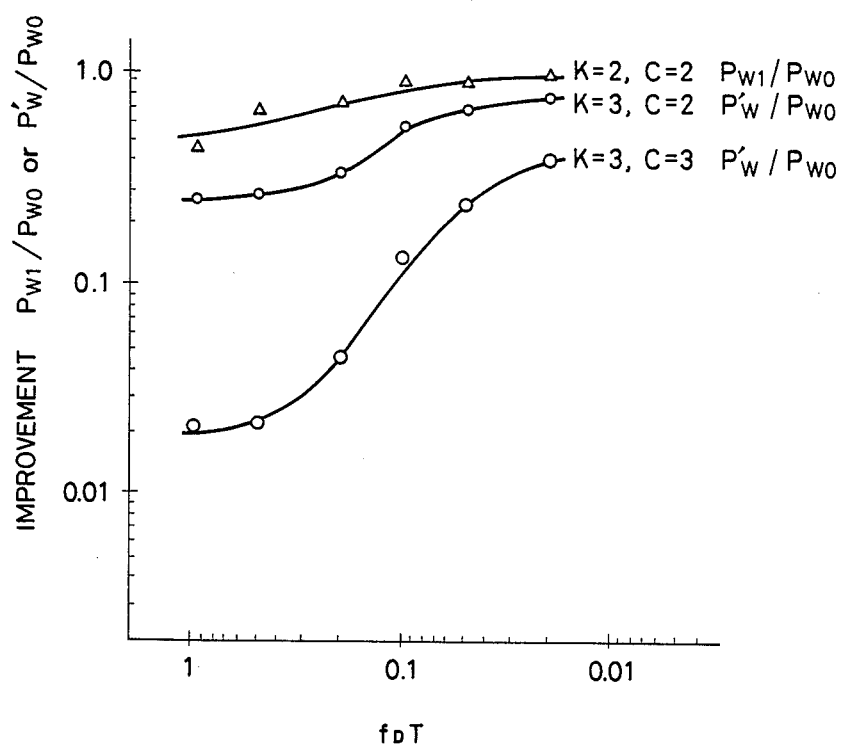
FIG. 12 is a graph showing examples of the simulation results of improvement versus $f_DT$ by the present invention.

FIG. 12 shows the relationships between $f_D T$ at an average receiving CNR value 10 dB, obtained from the results depicted in FIGS. 11A, 11B and 11C, and the amounts of word error probability improvement $P_{w1}/P_{w0}$ and $P_w'/P_{w0}$. It is seen from FIG. 12 that when $f_D T$ is 0.01, the word error probability is scarcely improved in the case (i), while in the case (ii) the amount of word error probability improvement is around $\tfrac{1}{2}$ (when K=3 and C=3) and $\tfrac{3}{4}$ (when K=3 and C=2).

As described above, this first invention permits the quasi-maximum likelihood decoding even in the case where the receiving electric field level greatly fluctuates as in mobile communication, and the improvement for a code with the code length N=23 and the code distance 2d +1=7 are as follows:

(1) In the case (i), the receiving CNR value for obtaining the word error probability $10^{-3}$ is improved by up to 2 dB.

(2) In the case (ii), it is improved by up to 4 dB.

While the first invention has been described in connection with a binary code of bit error correction capability, the invention is applicable directly to the decoding of a byte error correction code such as a Read Solomon code.

Second And Third Inventions

Figure 1:
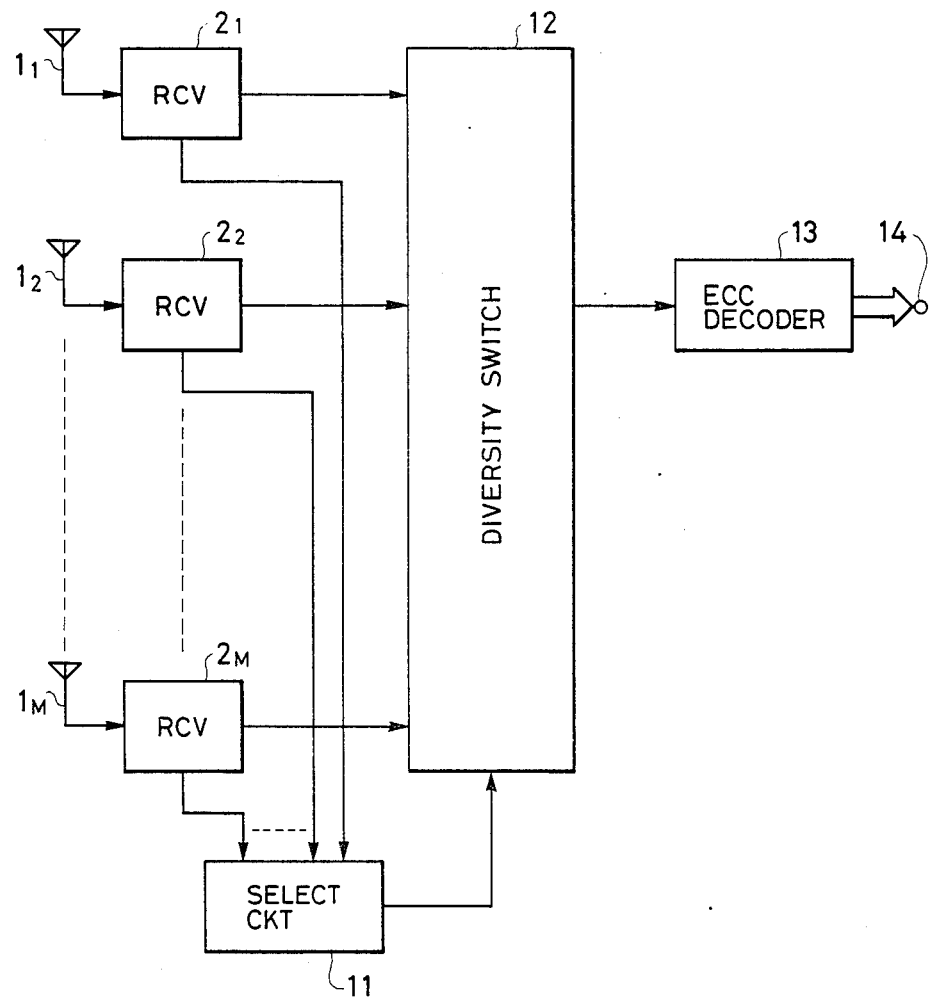
FIG. 1 is a block diagram showing an error correcting block decoding system in the conventional diversity reception system.
Figure 2:
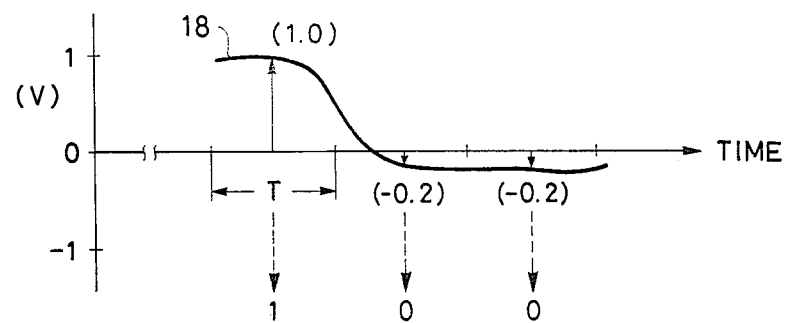
FIG. 2 is a diagram showing the relation between a detected waveform and its bitwise decoding.
Figure 13:
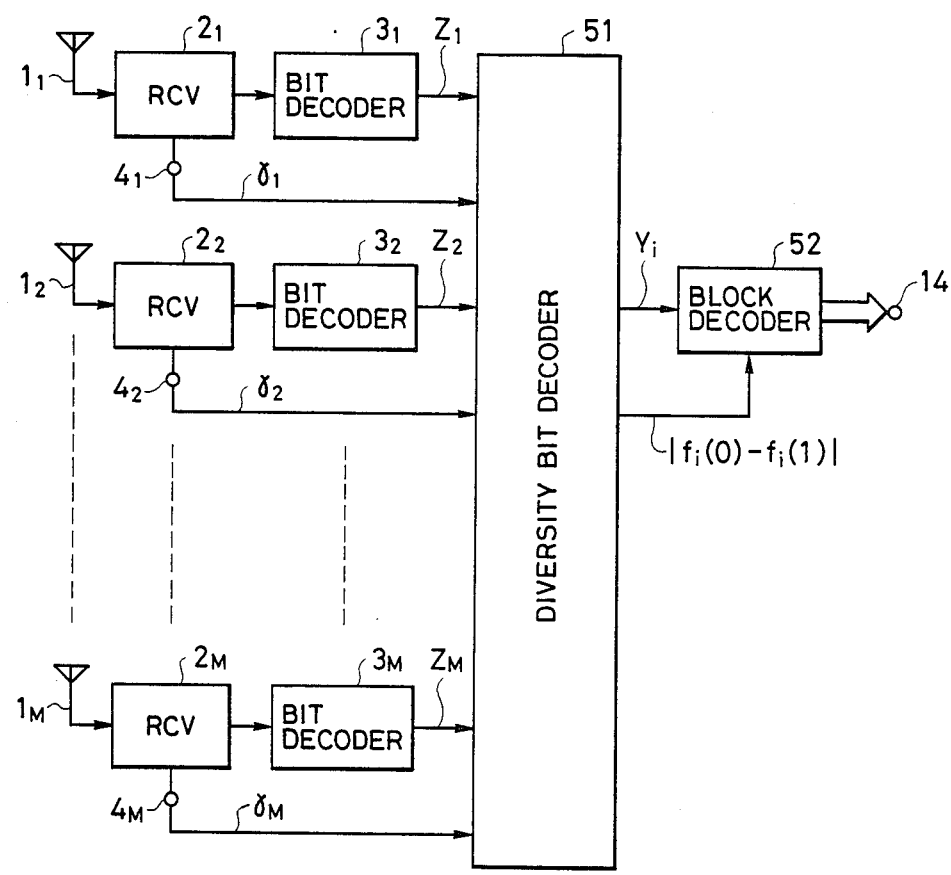
FIG. 13 is a block diagram illustrating embodiments of the second and third inventions.

FIG. 13 illustrates an embodiment implementing both second and third inventions, in which the parts corresponding to those in FIG. 1 are identified by the same reference numerals. In this embodiment the demodulated outputs from the receivers $2_1$ to $2_M$ are respectively provided to the bit decoders $3_1$ to $3_M$, wherein they are decoded to "0" or "1" on a bitwise basis. The results of decoding, that is, the corresponding i-th received digits $Z_{i1}$ to $Z_{iM}$ of respective receiving branches are applied to a diversity bit decoder 51. A set of corresponding i-th received digits $Z_{i1}$ to $Z_{iM}$ will hereinafter be referred to as an i-th received diversity-bit word and represented by $Z_i$. Further, receiving electric field levels $\gamma_l$ to $\gamma_M$ detected in the receivers $2_1$ to $2_M$ are also supplied to the diversity bit decoder 51 via terminals $4_1$ to $4_M$. In the diversity bit decoder 51, the i-th received diversity-bit word $Z_i$ is decoded to "0" or "1" by calculating the afore-mentioned expression (4), that is, $$\sum_{k=1}^{M} \gamma_{ik}(Z_{ik} \oplus D_{pk}) \to \min_{D_p \in \Omega_D}$$

on the basis of an input diversity-bit word $Z_i$ composed of corresponding i-th digits $Z_{i1}$ to $Z_{iM}$ of respective receiving branches, the receiving level $\gamma_I=(\gamma_{i1}$ to $\gamma_{iM})$ a transmitted diversity-bit word $D_p$ which is either M-bit word $D_0=\{0, \ldots, 0\}$ of all "0" bits or M-bit word $D_1=\{1, \ldots, 1\}$ of all "1" bits. The bitwise decoded output, that is, the i-th received digit $Y_i$ is provided to a block decoder 52. In conventional diversity, the bitwise decoding output with the maximum receiving electric field level is selected, but according to this second invention, the receiving electric field level or CN ratio in each receiving branch is effectively used, by which bitwise decoding can be achieved accurately and the subsequent decoding of block code also becomes accurate.

Figure 14:
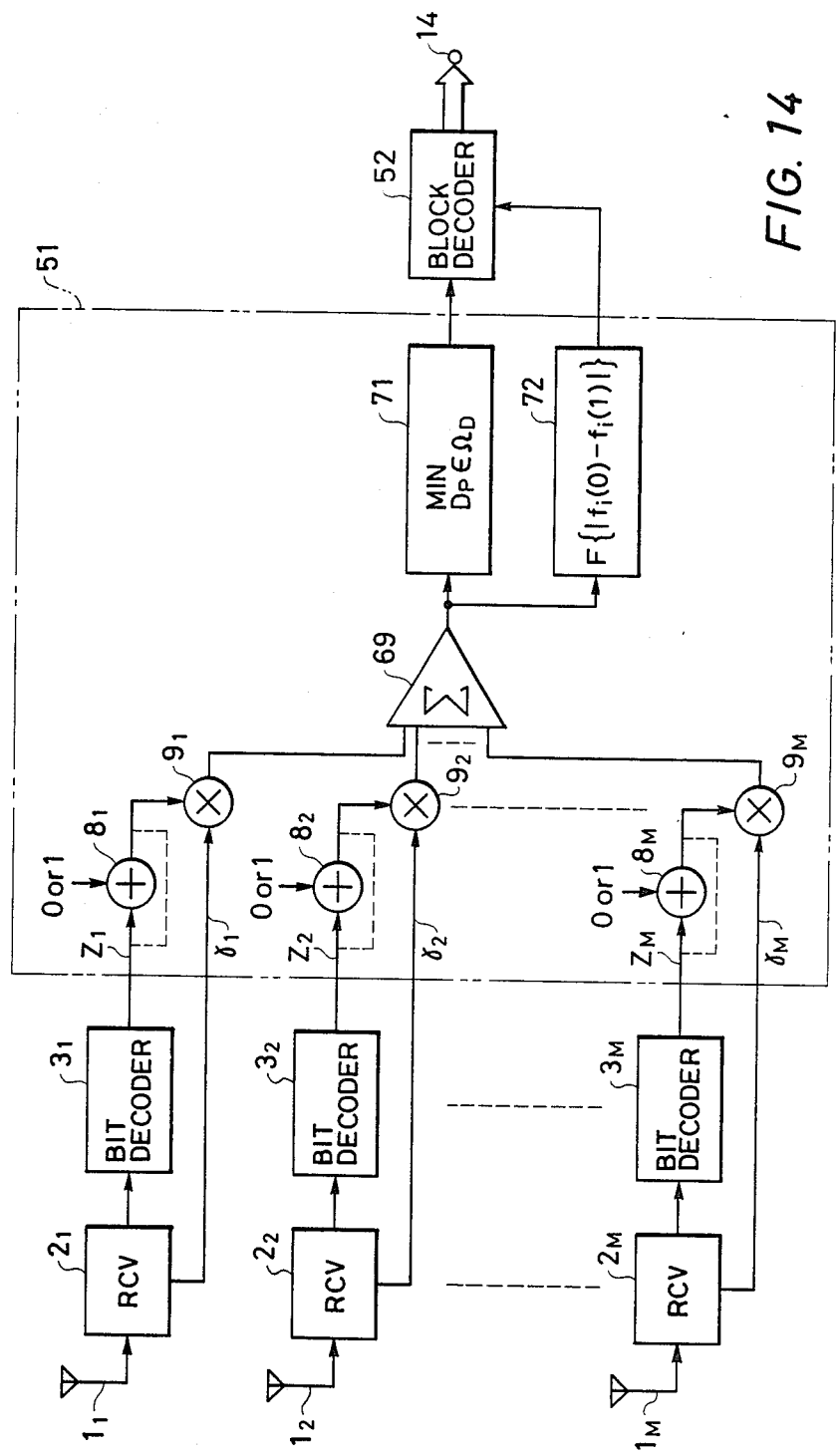
FIG. 14 is a block diagram illustrating a specific example of a diversity bit decoder 51 in FIG. 13.

FIG. 14 illustrates a specific operative example of the diversity bit decoder 51. In exclusive OR circuits $8_1$ to $8_M$ the bit decoder outputs $Z_1$ to $Z_M$ are respectively EXCLUSIVE ORed with "0" and "1" (i.e. the candidate word $D_0$ and $D_1$), and the outputs are respectively multiplied by the receiving electric field levels $\gamma_l$ to $\gamma_M$ in multipliers $9_1$ to $9_M$. The multiplied outputs are added together by an adder 69 for each transmitted diversity-bit word $D_0$ and $D_1$, obtaining $f_i(0)$ and $f_i(1)$. These outputs are compared with each other in a discriminator 71, and the transmitted diversity-bit word $D_0$ or $D_1$ which corresponds to the smaller one of $f_i(0)$ and $f_i(1)$ is determined as the decoded output of each digit $Y_i$. On the other hand, the output of the adder 69 is applied to a reliability information generating circuit 72 as well, obtaining reliability information $F\{|f_i(0)-f_i(1)|\}$. The operations by the exclusive OR circuits $8_1$ to $8_M$, the multipliers $9_1$ to $9_M$, the adder 69, and the discriminator 71 until the decoding of each digit are performed by this second invention.

According to the third invention, reliability information $|f_i(0)-f_i(1)|$ for each decoded digit $Y_i$ is also calculated in the diversity decoder 51 and is applied to a block decoder 52. Based on the decoded digit $Y_i$, the reliability information $|f_i(0)-f_i(1)|$, and the code word $X_j$ which becomes a candidate for decoding result, the block decoder 52 performs block decoding by calculating the expression (7'), which is a modification of the expression (7).

$$\sum_{i=1}^{N} F\{|f_i(0) - f_i(1)|\}(Y_i \oplus X_{ji}) \to \min_{X_j \in \Omega_x} \quad (7')$$

In the above, $F\{\ \}$ represents a function for quantization.

Next, the operation of this embodiment will be described concretely. For the sake of brevity, the following description will be given for the case where the block code is a (7, 4) Hamming code which is a sort of error correcting block code. Let it be assumed that the number of receiving branches M is three, that a word $T=(1000101)$ is transmitted from the transmitting side, and that at the receiving side the receivers $2_1$, $2_2$ and $2_3$ receive the transmitted word at such receiving electric field levels $\gamma_1$, $\gamma_2$ and $\gamma_3$ as indicated by the curves $5_1$, $5_2$ and $5_3$ in FIG. 15. The receiving field levels at the bitwise decision of the first to seventh digits in the respective receiving branches are such as given in the rows of the receiving electric field levels $\gamma_1$, $\gamma_2$ and $\gamma_3$, based on the curves $5_1$, $5_2$ and $5_3$. Here, the receiving field levels are given in decibel. In the description previously made of the first invention, the receiving field levels are each expressed in terms of the true value of the CN ratio for the strictness of mathematical expressions in explaining the effects of the first invention. However, since the same results as mentioned previously could be produced even by using the weight $W(\gamma)$ which is a monotone increasing function of the receiving field level, as referred to previously with regard to the first invention, the receiving field levels in decibel will hereinafter be used.

Figure 15:
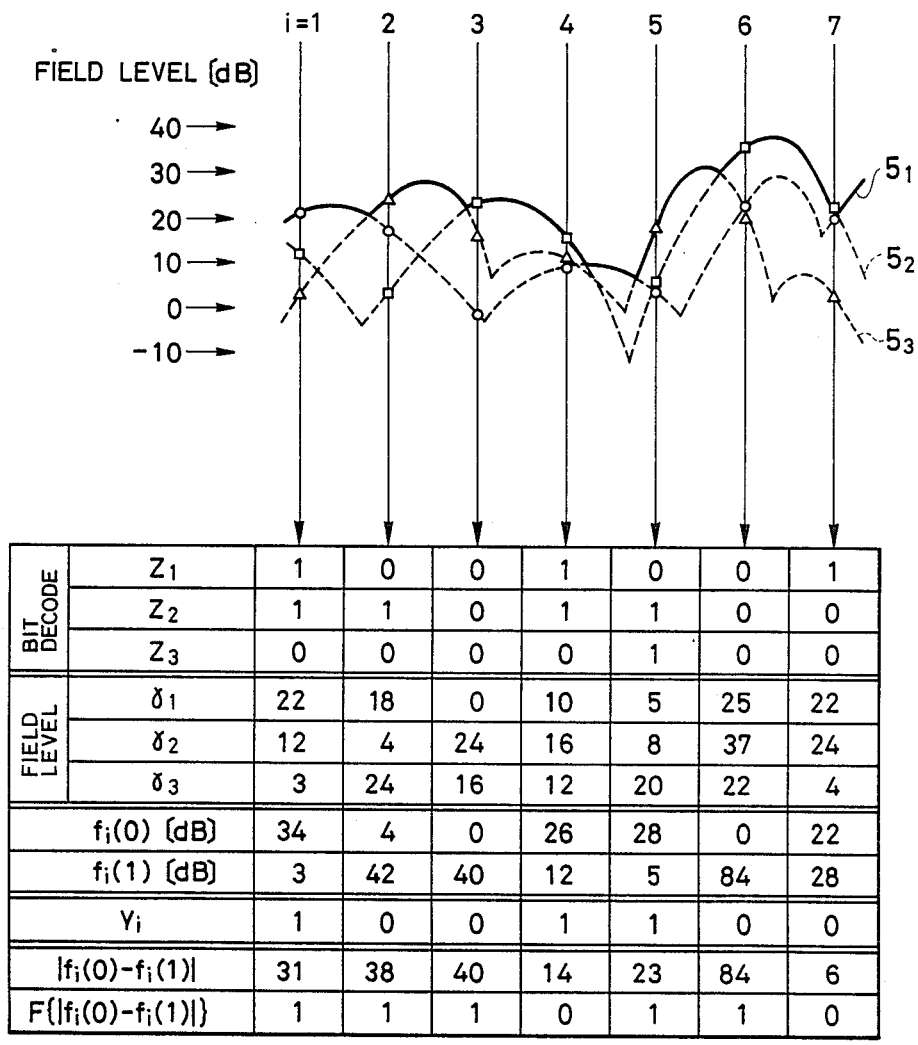
FIG. 15 is a diagram for explaining the operation of the example shown in FIG. 14.

Let it be assumed that the results of bitwise decision in the respective receiving branches, from the bit decoders $3_1$, $3_2$ and $3_3$, are such as given in the rows of the bit decoded signals $Z_1$, $Z_2$ and $Z_3$ in FIG. 15. According to the prior art decoding method described with respect to FIG. 1, the decoding becomes erroneous in this case. The diversity switch 12 provides the demodulated output of that one of the first to third receiving branches with the maximum receiving field level, that is, the output of the receiving branch corresponding to the electric field level at each digit on the solid line in FIG. 15 is provided as the decide bit. In consequence, the received word is $Z=(1001100)$, and its exclusive OR with the transmitted word T becomes as follows:

$$Z \oplus T = (0001001)$$

in which there are two bit errors. The code distance of the Hamming (7, 4) code is 3 and the error correcting capability is one bit. Accordingly, the decoding result of the received word Z is erroneous.

In this instance, however, according to the decoding system of the third invention, correct decoding can be accomplished as described below. The operation starts with the calculation of the value on the left-hand side of the expression (7), that is, $f_i(0)$ and $f_i(1)$ by the expressions (5) and (6), assuming a "0" and "1" have been transmitted from the transmitting side at an i-th digit. In the case of "0":

The values $f_i(0)=(34, 4, 0, 26, 28, 0, 22)$ dB are obtained by adding together all the receiving field levels at the i-th digits in the respective receiving branches in which "1s" have been decoded.

In the case of "1":

The values $f_i(1) = (3, 42, 40, 12, 5, 84, 28)$ dB are obtained by adding together all the receiving field levels at the i-th digits in the respective receiving branches in which "0s" have been decoded.

The bitwise decoding is performed by the expression (7), using the thus obtained values. Namely, the result of decoding $Y_i$ for each digit is provided as the candidate word $D_0(=0)$ or $D_1(=1)$ corresponding to the smaller one of the values $f_i(0)$ and $f_i(1)$. As a result of this, the received word is $Y = (1001100)$. Since this received word Y is identical with the output word Z from the diversity switch 12 in the case of the prior art method, it has also two bit errors. Next, the reliability information is calculated. The values for the first to seventh digits of $|f_i(0) - f_i(1)|$ become as follows:

$$|f_i(0) - f_i(1)| = (31, 38, 40, 14, 23, 84, 6).$$

For the sake of simplicity, these values are quantized into binary form by using such a function as follows:

$$F\{x\} = \begin{bmatrix} 0: x \leq 20 \\ 1: x > 20 \end{bmatrix}$$

As a result of this, the series $F\{|f_i(0) - f_i(1)|\}$ becomes as follows:

$$F\{|f_i(0) - f_i(1)|\} = (1110110)$$

Figures 16, 17:
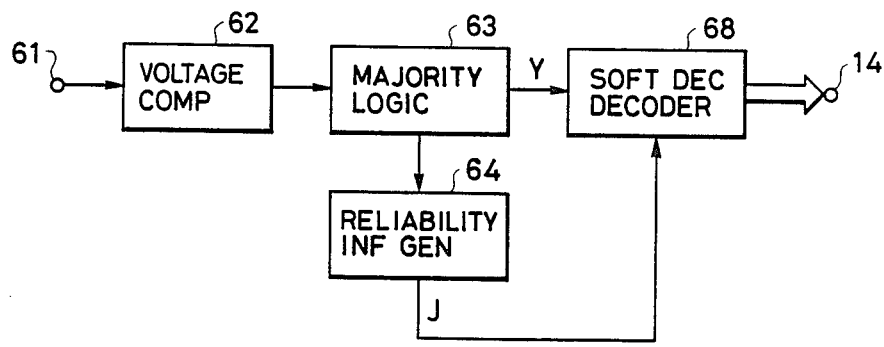
FIG. 16 is a table showing (7, 4) Hamming code words and calculated values of the left-hand sides of expressions (7'), (17) and (1)
FIG. 17 is a block diagram illustrating an embodiment of the fourth invention.

The above process is shown in FIG. 15, too. As depicted in FIG. 16, there are 16 code words of the (7, 4) Hamming code. The values of the left-hand side of the expression (7'), calculated for these code words, are such as given in the column "left side of expression (7")". For the code word $X_1 = (1000101)$, the result of calculation is $$\sum_{i=1}^{7} F\{|f_i(0) - f_i(1)|\} \cdot (Y_i \oplus X_{ji}) = 0.$$

This is minimum in the above-noted column in FIG. 16, indicating that the code word $X_1$ corresponds to the aforesaid transmitted word T and that the transmitted word has been decoded correctly.

In the case of the code word $X_9 = (1001110)$, it becomes that $Y \oplus X_9 = (0000010)$, which contains only one bit error that is regarded as permissible owing to one bit error correcting capability of (7, 4) Hamming code whose minimum code distance is 3. That is, the code word $X_9$, which is different from the transmitted word T, is erroneously determined to be the decoded word by the minimum distance error correcting process. According to the third invention, however, the result of calculation of the left-hand side of the expression (7') for the code word $X_9$ is given as follows:

$$\sum_{i=1}^{7} F\{|f_i(0) - f_i(1)|\} \cdot (Y_i \oplus X_{9i}) = 1.$$

This value is not minimum, so that there is no possibility of the code word $X_9$ being decoded as the decoding result.

As described above, the third invention ensures correct decoding even for a received word that should be rejected as being unreliable or that will be erroneously decoded according to the conventional method. An efficient algorithm for implementing the expressions (2) and (7') are set forth in detail in the afore-noted literature and can easily be put to practical use. In other words, the decoding system of the third invention permits the extension of the error correcting capability simply by modifying software for implementing the conventional decoding algorithm.

The above-described embodiment has been described with respect to the case of space diversity and in which a transmitted signal is demodulated through a plurality of receivers, but in the case of employing the time diversity system which transmits the same code a plurality of times, one receiver is enough and it is necessary only that the decoded outputs of corresponding bits in respective sequentially received words be regarded as to correspond to the decoded outputs $Z_i$ of the respective receiving branches. Further, the same results as set forth above could be obtained even if, for example, the following functions are used in place of the reliability information $|f_i(0) - f_i(1)|$ in the expression (7).

$$\begin{bmatrix} f_i(0)/f_i(1) \text{ for } Y_i = 0 \\ f_i(1)/f_i(0) \text{ for } Y_i = 1 \end{bmatrix}$$

In the above, one of the transmitted diversity-bit words $D_0 = \{00 \ldots 0\}$ and $D_1 = \{11 \ldots 1\}$ which is smaller in the sum of receiving field levels in the receiving branches in which disagreements were detected is provided as the decoded output $Y_i$ from the diversity decoder 51. But, it is also possible to arrange such that one of the transmitted diversity-bit words which is larger in the sum of receiving levels in the receiving branches in which agreements were detected is provided as the decoded output $Y_i$. Moreover, in the above, the code word $X_j$ which minimizes the sum total of reliability information for the digits where the received word Y and the candidate code word $X_j$ disagree is decided to be a decoded word, but the candidate code word $X_j$ which maximizes the sum total of reliability information for the digits where the received word Y and the code word $X_j$ agree may also be decided to be a decoded word.

Fourth Invention

In this fourth invention, the receiving field levels $\gamma_1$ to $\gamma_M$ in the second and third inventions are not based on actually measured values but are held equal. FIG. 17 illustrates an embodiment of the fourth invention as being applied to the time diversity system. Repeatedly received block words from a receiving input terminal 61 are applied to a voltage comparator 62, wherein each bit is decided to be a "mark" (1) or "space" (0) by voltage comparison. The resulting "mark/space" sequence is provided to a majority logic 63, wherein corresponding bits of the plural block words are subjected to majority decision to decide each digit, thereafter being output as a decided block word. The plural block words in the majority logic 63 are supplied to a reliability information generating circuit 64, wherein addition is performed with +1 for the "mark" and −1 for the "space" for respective corresponding bits of the plural block words, thereby obtaining a weight coefficient $J_i$ as reliability information for each bit of the block word.

Figure 18:
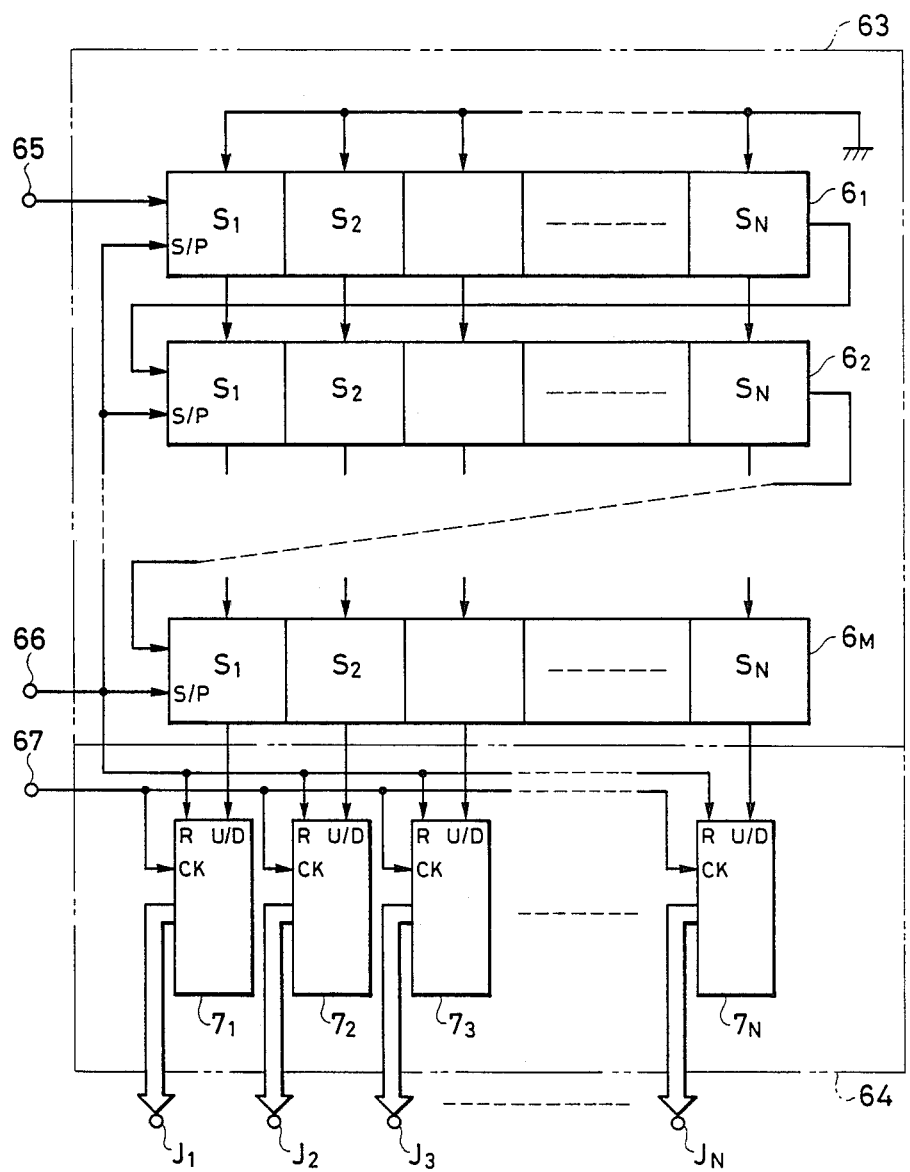
FIG. 18 is a block diagram illustrating specific examples of a majority logic 63 and a reliability information generating circuit 64.

FIG. 18 illustrates specific examples of the majority logic 63 and the reliability information generating circuit 64. In the majority logic 63, the mark/space string from the comparator 62 is applied, for example, via an input terminal 65 to a data terminal at one end of a series connection of serial-in serial-out/parallel-in parallel-out shift registers $6_1$ to $6_M$, where M is the number of repetitive transmissions of the same information block code from the transmitting side. The shift registers $6_1$ to $6_M$ each comprise N stages, where N is equal to the length of the block code, and these shift registers $6_1$ to $6_M$ have parallel data output terminals of their corresponding stages connected to parallel data input terminals of the succeeding stages in that order. The parallel data input terminals of the first-stage shift register $6_1$ are grounded. The registers $6_1$ to $6_M$ are each switched between a serial operation and a parallel operation by a serial/parallel control signal from a terminal 66. Though not shown, there is provided a majority logic circuit which receives the outputs from the parallel data output terminals of the respective corresponding stages of the shift registers $6_1$ to $6_M$ and decides them by majority, the result being output as a decided block word from the majority logic 63.

The parallel data output terminals of the respective stages of the final-stage shift register $6_M$ are connected to up/down switching terminals of reversible counters $7_1$ to $7_N$ in the reliability information generating circuit 64. The reversible counters $7_1$ to $7_N$ are each supplied at a clock input terminal with a bit synchronizing pulse from a terminal 67 and at a reset terminal with the parallel/serial control signal from the terminal 66.

With this arrangement, a signal is applied to the serial/parallel control terminal 66 to set first to the "serial" side, by which the "mark/space" string which is the decision result for each bit, is fed from the terminal 65 into the series connection of shift registers $6_1$ to $6_M$. Thus, the shift registers $6_1$ to $6_M$ are supplied with the respective M block words and the corresponding digits of the blocks are retained in the corresponding stages $S_1$ to $S_N$ of the shift registers $6_1$ to $6_M$. When the parallel/serial control signal from the terminal 66 is made "serial", the reversible counters $7_1$ to $7_N$ are immediately reset.

Next, the parallel/serial control terminal 66 is switched to the "parallel" side, by which the values "0s" or "1s" in the stages $S_1$ to $S_N$ of each shift register $6_1$ to $6_M$ are shifted into the up/down switching terminals of the counters $7_1$ to $7_M$. Each of the reversible counters $7_1$ to $7_N$ enters the count-up or count-down mode depending upon whether each corresponding digit of the respective block words is "1" or "0", and count the bit synchronizing pulses from the terminal 67. The bit synchronizing pulse is a clock pulse synchronized with each bit of the input block word, or a clock pulse of a velocity proportional thereto. The count values of the reversible counters $7_1$ to $7_N$ at the time when all block words have been provided thereto from the shift registers $6_1$ through $6_M$ are used as reliability information $J_1$ through $J_N$ being sought. Further, a mark or space is provided as the result of majority decision depending upon whether the count value of each reversible counters $7_1$ to $7_N$ is positive or negative. The afore-mentioned majority circuit (not shown) for providing the decided block word could be implemented by a circuit arrangement in which decision circuits (not shown) are respectively connected to the output terminals of the reversible counters $7_1$ through $7_N$ of the reliability information generating circuit 64 so that they provide logic "1s" or "0s" in dependence upon whether the count values $J_1$ to $J_N$ of the counters $7_1$ to $7_N$ are positive or negative.

Turning back to FIG. 17, the decided block word (or more simply, decided word) Y from the majority logic 63 and the reliability information J from the reliability information generating circuit 64 are provided to a soft decision decoder (a block decoder) 68. The soft decision decoder 68 yields, as a decoded output for the decided block word Y and the reliability information J, a code word which satisfies the expression (17):

$$\sum_{i=1}^{N} |J_i| \cdot (Y_i \oplus X_{ji}) \to \min_{X_j \in \Omega_x} \tag{17}$$

Next, a description will be given of this illustrated specific example. For the sake of brevity, let it be considered that a (7, 4) Hamming code has been transmitted as the block code three times (i.e. M=3). In this instance, it is logically evident that in the following two cases the result of majority decision produces "1".

J(3): {mark all three times}
J(2): {mark twice and space once}

Accordingly, the reliability information J is given as J=3 for J(3) and J=1 for J(2). Now, consider that the word T=(1000101) is transmitted three times. Again, the transmitted word T is a (7, 4) Hamming code word. Let it be assumed that the following three received words before being subjected to majority decision have been produced owing to noise in the transmission path.

$R_1 = (0001101)$ $R_2 = (1001111)$ $R_3 = (1000111)$

In the above, "1" represent a "mark" and "0" a "space". The received words $R_1$ and $R_2$ contain two bit errors and $R_3$ one bit error. According to a prior art method, correct decoding cannot be accomplished as will be described below.

The (7, 4) Hamming code decoding is applied to the received words $R_1$, $R_2$ and $R_3$ independently of one another. In this instance, since the code distance of the (7, 4) Hamming code is three, the received words $R_1$ and $R_2$ will result in erroneous decoding, and the received word $R_3$ will be decoded correctly. However, since these words are decoded into different codes, the majority decision cannot be conducted, resulting in all the received words being rejected as being unreliable.

According to another conventional method, the majority decision is performed for corresponding bits of the received words $R_1$, $R_2$ and $R_3$, obtaining a decided block word Y=(1001111). But this decided block word Y also contains two bit errors because the exclusive OR of the corresponding bits between the decided block word Y and the transmitted code word T is as follows:

$Y \oplus T = (0001010)$

Accordingly, the decided block word Y would be erroneously decoded.

In contrast thereto, the fourth invention permits correct decoding as described below. The majority decision result for the corresponding bits of the received words $R_1$, $R_2$ and $R_3$, that is, the decided block word is given as follows:

$$Y = (1001111)$$

The reliability information corresponding thereto is as follows:

$$J = (1, -3, -3, 1, 3, 1, 3)$$

As shown in FIG. 16, there are 16 (7, 4) Hamming code words for which the left-hand side of the expression (17) is calculated and the results are listed in the designated column in FIG. 16. In this case, as depicted in FIG. 16, the following value is obtained for the code word $X_1 = (1000101)$ (j=1):

$$\sum_{i=1}^{7} |J_i|(Y_i \oplus X_{1i}) = 2.$$

This value is smaller than the values obtained for the other code words, and the code word $X_1$ is determined as the transmitted word $T = (1000101)$. On the other hand, for instance, in the case of the code word $X_9 = (1001110)$, which is one of the (7, 4) Hamming code words, it becomes that $X_9 \oplus Y = (0000001)$, and the decided block word Y could be determined as a word having one bit error compared to the code word $X_9$. That is, with the conventional error decoding operation, there is a fear that the decided block word Y could be erroneously decoded to the code word $X_9$. According to this fourth invention, however, the value of the left-hand side of the expression (17) for the code word $X_9$ (j=9) is as follows:

$$\sum_{i=1}^{7} |J_i|(Y_i \oplus X_{9i}) = 3.$$

This is not the smallest among the results of calculation shown in FIG. 16, and so there is no possibility of the decided block word Y being erroneously decoded to the code word $X_9$.

In the above, the expression (17) is calculated for all possible code words, which are candidates for decoding, and a code word is obtained which is minimum in the calculated value. This does not pose any problem when the code words are relatively small in code length like the (7, 4) Hamming code, but in the case of a code such as BCH (63, 51) used for NTT's mobile communication system, the calculation of the expression (17) for all code words which are candidates for decoding will need an enormous computational quantity, and hence is impractical. Yet, an efficient algorithm for obtaining such a code word of the minimum value of the expression (17) can be implemented through utilization of techniques described in detail in the afore-noted literatures.

In FIG. 18, the decided block word and the reliability information may also be obtained by software, instead of using the majority logic 63 and the reliability information generating circuit 64. In the above example, the reliability information values at the respective digits showing disagreements between the decided block word Y and each code word are added together, and a code word which gives the smallest sum is determined as a correct code word in accordance with the expression (17). It is also possible, however, to determine a code word which gives the largest sum of the reliability information values at the respective digits showing agreements between the decided block word Y and the code word X.

As described above, the fourth invention permits correct decoding of even such a decided block word that would be rejected or erroneously decoded according to the conventional methods, and hence the fourth invention enlarges the error correcting capability. In addition, since a hard decision is made bit by bit through use of a voltage comparator, substantially no increase in the amount of hardware is needed for the implementation of this fourth invention and the circuits used therefor can be formed mostly by digital circuits.

Figure 19:
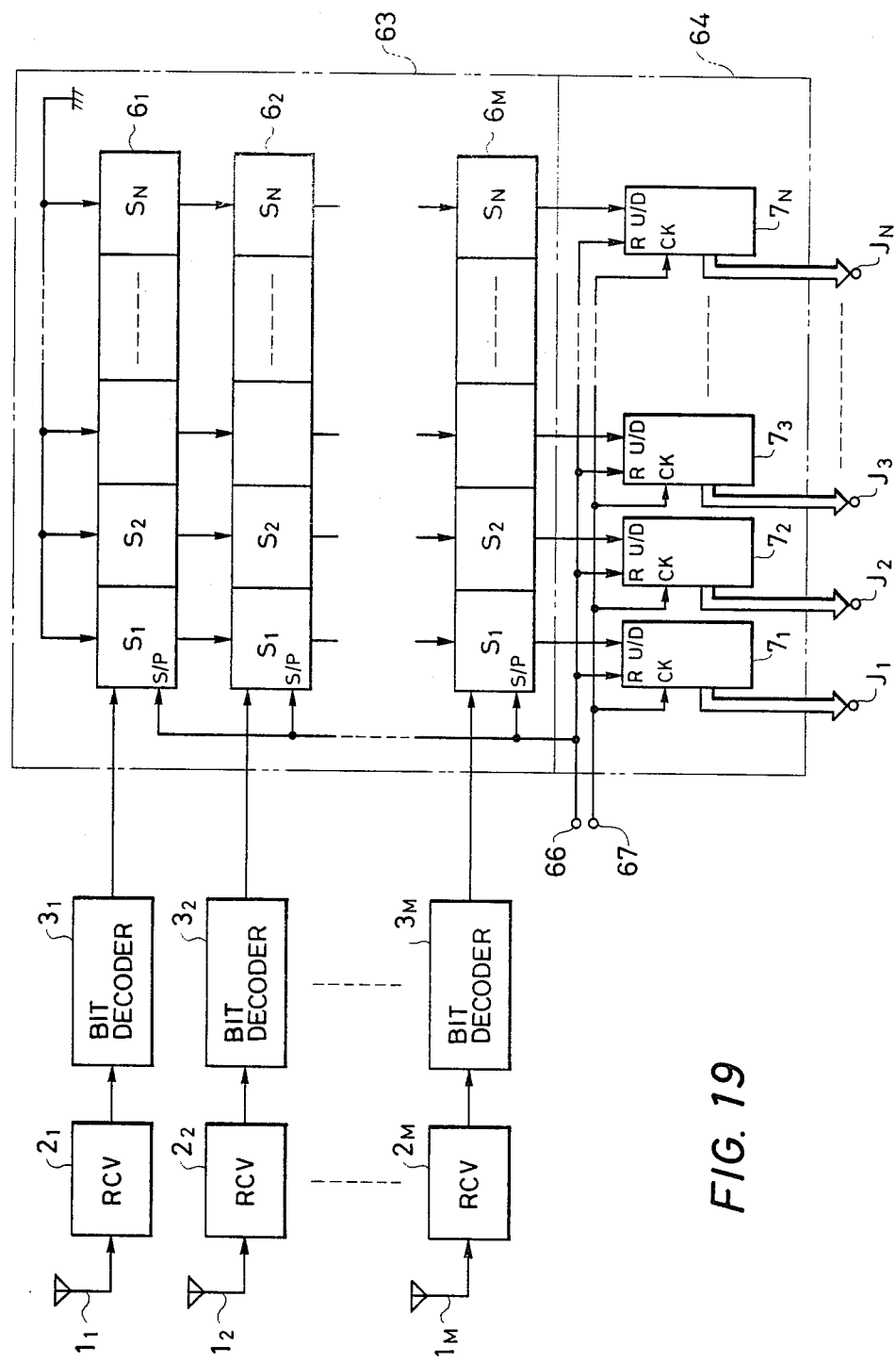
FIG. 19 is a block diagram illustrating an example of the fourth invention applied to the space diversity reception system.

The fourth invention is also applicable to the decoding of received words in the space diversity, as shown in FIG. 19 in which those parts corresponding to those in FIGS. 14 and 18 are identified by the same reference numerals. This embodiment is equivalent to carrying out the second and third inventions with all the receiving field levels $\gamma_1$ through $\gamma_M$ regarded as a constant "1", for example. Thus, the multipliers $9_1$ through $9_M$ and the paths for the receiving field levels $\gamma_1$ through $\gamma_M$ in FIG. 14 would become obsolete. Moreover, the shift registers $6_1$ to $6_M$ are not connected in series, but instead the corresponding digit outputs $Y_{i1}$ to $Y_{iM}$ forming a received diversity-bit word are supplied to the first stages of the shift registers $6_1$ to $6_M$. This example is identical with that of FIG. 18 in the other points, and so no detailed description will be repeated with regard to this embodiment.

FIFTH INVENTION

Next, a description will be given of an embodiment of the fifth invention, in which the difference in the time occupancy ratio (hereinafter referred to as TOR difference) in each bit between "high" and "low" levels of the output of a voltage comparator for use in bitwise decision is utilized as reliability information. This will hereinbelow be described with reference to FIGS. 20A through 20G. Now, consider that such a detected waveform as shown in FIG. 20B has been obtained for a transmitted waveform of one high-level bit such as depicted in FIG. 20A. The voltage comparator output for this detected waveform is such as shown in FIG. 20C. Provided that the relative time length of this decoded one bit is 10, as shown, the voltage comparator output (FIG. 20C) includes a high level of a length 4 (a positive component of the detected waveform), a low level of a length 1 (a negative component of the detected waveform), and a high level of a length 5. Accordingly, the TOR difference $l_1$ in bit between the high and low levels is $|(4+5)-1| = 8$. In the case where the transmitted waveform of FIG. 20A is received as such a detected waveform as depicted in FIG. 20D, the voltage comparator output includes a high level of a length 3, a low level of a length 3, and a high level of a length 4, as shown in FIG. 20E, and the TOR difference $l_2$ in bit between the high and low levels is $|(3+4)-3| = 4$. Where the transmitted waveform of FIG. 20A is detected as such a waveform as depicted in FIG. 20F, the voltage comparator output includes a high level of a length 1, a low level of a length 1, a high level of a length 1, a low level of a length 2, a high level of a length 1, a low level of a length 3, and a high level of a length 1, as shown in FIG. 20C. In this case, the TOR difference $l_3$ in bit between the high and low levels is $|(1+1+1+1)-(1+2+3)| = 2.$ The TOR differences $l_1$ (=8), $l_2$ (=4) and $l_3$ (=2) represent reliability values, i.e. reliability information of the detected waveforms of FIGS. 20B, 20D and 20F, respectively.

Such a TOR difference can be measured by a simple circuit. By using the TOR difference as the reliability information, instead of using the afore-mentioned level value $l_i$ in the conventional soft decision decoding of block code, it is possible to perform soft decision decoding for each frame while at the same time conducting hard decision decoding for each bit by the voltage comparator. In this case, the bitwise decoding may be effected according to the decision result, that is, according to whether the comparison output level is positive or negative at a given deciding timing for each bit, as in the prior art, but it is also possible to employ, as the result of bit decoding, one of the high and low levels which provides a larger time occupancy ratio than the other does in each bit. On the other hand, since the block decoding is performed through the soft decision using the reliability information for each bit, the error correcting capability of the error correcting code is increased as compared with the case where the hard decision is employed for the block decoding, and it can be expected that the rejected word rate will be lessen.

Figure 21:
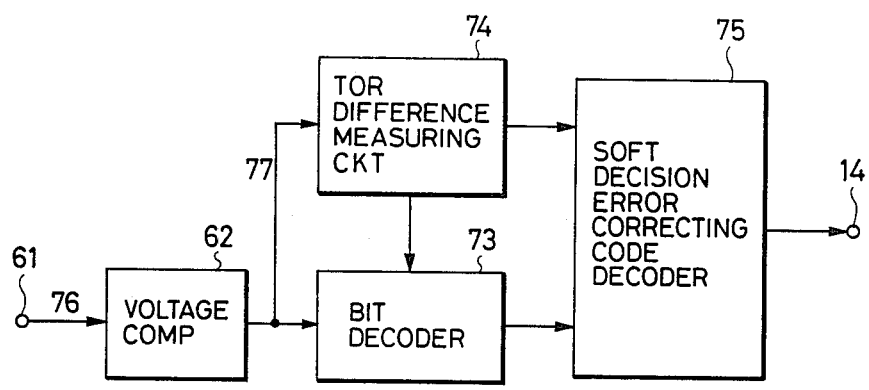
FIG. 21 is a block diagram illustrating an embodiment of the fifth invention.

FIG. 21 illustrates an embodiment of this fifth invention, in which the input signal from the input terminal 61 is applied to the voltage comparator 62, the output of which is supplied to a bit decoder 73 and a TOR difference measuring circuit 74. The decoded output from the bit decoder 73 and the measured output from the TOR difference measuring circuit 74 are provided to a soft decision error correcting decoder (a block decoder) 75, from which a decoded block is provided to the output terminal 14.

Figure 22:
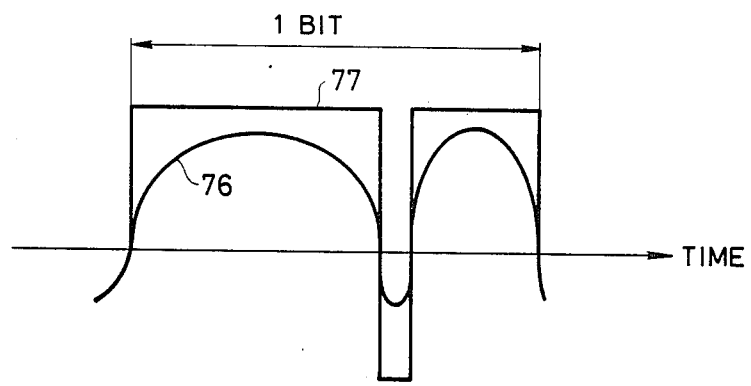
FIG. 22 is a diagram showing, by way of example, the relation between the detected waveform and the voltage comparator output, for explaining the fifth invention.

Assume that an input signal of such a detected waveform as indicated by 76 in FIG. 22 has been input from the input terminal 61. In the voltage comparator 62, positive and negative components of the input signal 76 are converted into high and low levels, respectively, developing such an output voltage as indicated by a waveform 77 in FIG. 22. The voltage output of the waveform 77 is decoded by the bit decoder 73 into a mark or space for each bit through the same method as employed in the prior art.

Figure 23:
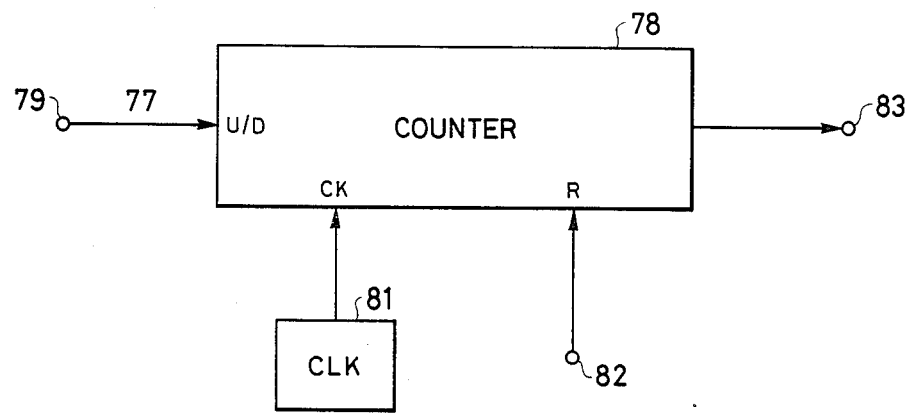
FIG. 23 is a block diagram showing a specific example of a TOR difference measuring circuit 74 in FIG. 21.

The voltage comparator output with the waveform 77 is applied to the TOR difference measuring circuit 74, wherein the TOR difference per bit between the high and low levels is measured. The TOR difference measuring circuit 74 can be formed, for instance, by a commercially available up/down counter 78 such as shown in FIG. 23. The up/down counter 78 is supplied at its count mode select terminal 79 with the output voltage from the voltage comparator 62. The up/down counter 78 enters the count up or count down mode depending upon whether the voltage applied thereto is high- or low-level. From a clock generator 81 clock pulses of a bit rate N times higher than the input signal from the input terminal 61 are applied to a clock terminal CK of the up/down counter 78 for counting therein. A reset pulse is applied to a reset terminal 82 of the up/down counter 78 in synchronism with the end of each bit. At the end of each bit of the input signal, the up/down counter 78 provides at its count output terminal 83 a value which is proportional to the time difference between the high and low levels of the comparator output in the bit, that is, the TOR difference in the bit. The value thus obtained is provided to the soft decision error correction decoder 75. Upon completion of the counting for each bit, the up/down counter 78 is reset, restarting the same operation for the next bit.

Figure 24:
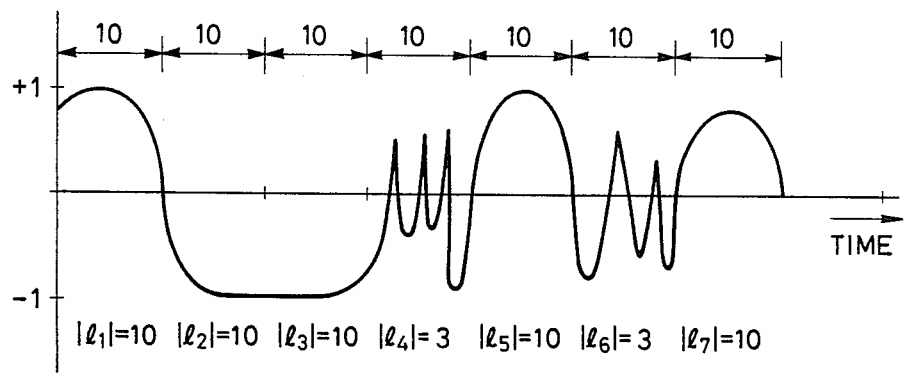
FIG. 24 is a diagram showing the relation between a detected waveform and reliability information, for explaining a concrete operation of the fifth invention.

Next, a description will be given of the operation of this embodiment in connection with the case of employing the (7, 4) Hamming code. The (7, 4) Hamming code words are shown in FIG. 16. Now, consider that the first (starting from zeroth) code word $X_1$ (1000101) in FIG. 16 has been sent from the transmitting side and that the demodulated waveform, i.e. detected waveform at the receiving side is such as shown in FIG. 24 owing to noise superimposed thereon during transmission, resulting in the received word Y (=1001111). In the conventional hard decision decoding, the code distance between the transmitted code word $X_1$ and the received word Y is 2 in this case, but since the code distance between the ninth code word $X_9$ in FIG. 16 and the received word Y is 1, the code word $X_9$ is regarded to have been transmitted; thus, erroneous decoding occurs.

In contrast thereto, the decoding method of this fifth invention ensures correct decoding of the transmitted word, as described below in respect of an example in which the TOR difference is measured by sampling at 10 points per bit. Given at the right-hand end of FIG. 16 are the results of calculation of the left-hand side of the expression (1) performed for the 16 Hamming code words through utilization of the reliability information $l_i$ for each bit from the comparator output on the assumption that the reliability information $l_i$ is such as depicted in FIG. 24. For the first code word $X_1 = (1000101)$, the result of calculation is as follows:

$$\sum_{i=1}^{7} |l_i|(Y_i \oplus X_{1i}) = 6.$$

For the code word $X_9 = (1001111)$, the result of calculation is 10. Calculation results for all the code words are listed in the right-most column of FIG. 16. Since the result of calculation for the code word $X_1$ is minimum, the code word $X_1$ is regarded to have been transmitted, thus correct decoding is achieved.

As described above, this fifth invention allows correct decoding of a received word which would be rejected or erroneously decoded in the case of the conventional hard decision decoding. An efficient algorithm for minimizing the expression (1) is set forth in detail in the aforementioned literature, and this method can easily be implemented by software employing a CPU for decoding the error correcting code.

The TOR difference measuring circuit for obtaining the reliability information can be formed by a commercially available IC with much ease, but its operation may also be accomplished by software processing.

As described above, this fifth invention is advantageous in that the capability of the error correcting code can be enlarged more than in the case of conventional hard decision decoding, without the necessity of using an A-D converter or like complex processing circuit.

Next, the effect of improvement by this fifth invention will be described quantitatively. According to the afore-noted literature, in the case of the soft decision decoding by the expression (1), when the code distance d is $2t_0 + 1$, a maximum of $2t_0$ errors can be corrected. Incidentally, according to the conventional hard decision decoding, only $t_0$ errors can be corrected at most. The decoding system of this fifth invention utilizes the value of the TOR difference between high and low levels of the comparator output, in place of the level value $|l_j|$ in the expression (1). Accordingly, if the sample number per bit is sufficiently large, the TOR difference well corresponds to a bit error probability in decoding the bit on the basis of the TOR difference itself such that one of high and low levels having a larger TOR is decided to be the decoding result of the bit. When $2t_0+1$ or more bit errors occur in one frame (i.e. one code word), the errors cannot be corrected and the received word will result in erroneous decoding. Therefore, the probability of producing $2t_0+1$ bit errors in a frame according to the above mentioned bit error probability is the lower limit of the code word error probability of the decoding system of this fifth invention. Namely, according to the fifth invention, error probability can be lowered to this limit in the best case.

In the case of the (23, 12) BCH code, for example, since the code distance d is 7, $d=2t_0+1=2\times 3+1$. Since $t_0=3$, the probability that 7 out of 23 bits are erroneous defines the lower limit of the code word error probability of the decoding method of the fifth invention. In practice, there is the possibility of erroneous decoding even if the number of error bits is six or less. According to the conventional hard decision decoding, a maximum of $t_0$ errors can be corrected for the code distance $2t_0+1$, and so the code word error probability is equal to the probability of occurrence of more than $t_0+1$ errors in one frame. This is equal to the probability that more than $4(t_0+1=3+1)$ out of 23 bits become erroneous in the case of the (23, 12) BCH code.

An example of the bitwise decoding based on the TOR difference between the high and low levels of the comparator outputs is reported in a literature (2) [Onoue, Suwa, and Hattori, "Integral Decoding and Transmission Characteristic of Split-Phase Signal", 1983 General Meeting of Institute of Electronics and Communication Engineers of Japan, No. 2167]in connection with the case where the bit rate is 300 b/s, a frequency deviation 4.5 kHz, the IF band width 16 kHz, and a fading frequency 20 Hz. The abovesaid characteristic is indicated by the curve 91 in FIG. 25. Based on the bit error probability characteristic of the curve 91, the lower limit of the code word error probability of the decoding system of the fifth invention and the code word error probability of the conventional hard decision decoding are obtained in the case of the (23, 12) BCH code on the assumption of random error. If errors are assumed to be random, then the code word error probability of the conventional hard decision decoding can be calculated by $$P_w = 1 - \sum_{i=0}^{3} {}_{23}C_i p^i (1-p)^{23-i},$$

and the lower limit of the cord word error probability of the decoding system of the fifth invention can be calculated by $$P_w' = 1 - \sum_{i=0}^{6} {}_{23}C_i p^i (1-p)^{23-i}.$$

In the above, p is a bit error probability, which can be obtained from the curve 91 in FIG. 25. The word error probabilities $P_w$ and $P_w'$ are shown as the curves 92 and 93 relative to the bit error probability p in FIG. 25. For instance, when the received electric field level is $-8$ dB$\mu$, $p=2\times 10^{-2}$, and the code word error probabilities $P_w$ and $P_w'$ in this case are as follows:

$$P_w \simeq 1.0 \times 10^{-3}$$

and $$P_w' \simeq 2.4 \times 10^{-7}.$$

When the received electric field level is $-$dB$\mu$, $p=2\times 10^{-3}$ and the code word error probabilities $P_w$ and $P_w'$ are as follows:

$$P_w \simeq 1.4 \times 10^{-7}$$

and $$P_w' \simeq 3.1 \times 10^{-14}.$$

Thus, according to the fifth invention, the word error probability characteristic is substantially improved over that in the conventional hard decision decoding.

While the first through fifth inventions have been described as being applied to the NRZ code, they are applicable to other codes as well.

What is claimed:

1. A method for decoding error correcting block codes having redundant bits added to information data bits transmitted as an error correcting block code, comprising:

a demodulating step for demodulating a received signal to produce a detected waveform;

a bitwise decoding step for conducting bitwise decoding on the detected wavform to produce a received word;

a level detecting step for detecting a receiving electric field level at each digit of the received word to obtain reliability information for the digit;

an erasure bit selecting step for selecting, as erasure bit, a predetermined number of digits in the received word at which values indicating the reliability information are smallest;

a pattern applying step for applying each of a plurality of possible bit patterns to the erasure bits of the received word to produce composite code words each having, at its bit positions corresponding to the erasure bits of the received word, respective bits of a corresponding one of the possible bit patterns;

a minumun distance decoding step to which each of said composite words is subjected to determine a plurality of candidate code words;

a comparison step for comparing each of said candidate code words with the received word for each digit and detecting a disagreement or agreement, if any, between each digit of the received word and a corresponding digit of the candidate code word;

a summing step for summing up only the reliability information corresponding to the digits where the candidate code word and the received word disagree or agree with each other, thereby producing a sum of the reliability information for each of the candidate code words; and a determining step for determining one of the candidate code words as a decoded result which gives the minimum or maximum one of the sums of the reliability information.

2. The decoding method according to claim 1 including a receiving step for receiving the transmitted signal by a plurality of receiving branches, wherein the demodulating step, the bitwise decoding step, and the level detecting step are carried out for each of the receiving branches to produce received words, and the summing step sums up only the receiving electric field levels in the respective receiving branches at the corresponding digits of the received words which disagree or or agree with "1" and sum up only the receiving electric field levels in teh respective receiving branches at the corresponding digits of the received words which disagree or agree with "0", thus producing two summations, and the determining step determines either "1" or "0" corresponding to the smaller or large one of the two summations as the decoding result of the corresponding digit of a decided received word.

3. The decoding method according to claim 2, wherein the two summations for each of the respective digits are used to produce the reliability information of the corresponding digit for determining the code word which gives the minimum or maximum sum or the reliability information.

4. The decoding method according to claim 3, wherein the reliability information is the absolute value of a difference between the two summations.

5. The decoding method according to claim 3, wherein the reliability information is a monotonic increasing function of the absolute value of a difference between the two summations.

6. The decoding method according to claim 2, wherein the detected receiving electric field levels are all set to a fixed value, and the difference between the two summations is used as the reliability information of the corresponding digit for determining one of the code word which gives the minimum or maximum sum of the reliability.

7. The decoding method according to claim 6, wherein the received words in the respective receiving branches are input into corresponding shift registers; then corresponding bits of the shift registers are connected in cascade to produce respective cascade bit outputs; a plurality of reversible counters are controlled by corresponding cascade bit outputs to count up or down a clock depending upon "1" or "0" of the respective cascade bit outputs, the respective reversible counters, have been made to correspond to the digits of received word; the digits of the received word are each majority decided to be a mark or space depending upon whether the count values of the reversible counters are positive or negative; and the count values are each used as the reliablility information for the corresponding digit.

8. A method for decoding block codes, comprising:
a step for receiving a transmitted signal by a plurality of receiving branches to produce demodulated waveforms of a frame in the respective receiving branches;
a step for conducting bitwise decoding on the demodulated waveforms to produce received words in the respective receiving branches;
a step for deciding the majority of "1" or "0" in the corresponding digits of the respective received words to produce a decided received word;
a step for producing a difference betwen the numbers of "1's" and "0's" in the correspondingg digits of the received words,
a step for producing an absolute value of said difference as reliability information of the corresponding digit of the decided received word;
an erasure bit selecting step for selecting, as erasure bits, a predetermined number of digits in the received word at which values indicating the reliability information are smallest;
a pattern applying step for applying each of a plurality of possible bit patterns to the erasure bits of the received word to produce composite code words each having, at its bit positions corresponding to the erasure bits of the received word, respective bits of a corresponding one of the possible bit patterns;
a minimum distance decoding step to which each of said composite code words is subjected to determine a plurality of candidate code words;
a step for comparing each of the candidate code words with the decided received word for each digit and detecting a disagreement or agreement, if any, between each digit of the decided received word and a corresponding digit of the candidate code word;
a step for summing up only the reliability information corresponding to the digits where each of the candidate code words and the decided received word disagree or agree with each other, thereby producing a sum of the reliability information for each of the candidate code words; and
a step for determining one of the code words as the decoded result which gives the minimum or maximum one of the sums of the reliability information.

9. A method for decoding block codes, comprising:
a step employing a voltage comparator for comparing a demodulated waveform with a reference voltage to produce a high or low level on the basis of the comparison result;
a step for detecting a difference in the time occupancy ratio between the high and low levels of the output of the voltage comparator in each regenerated bit to obtain reliability information corresponding to a digit;
a step for conducting bitwise decoding on the demodulated waveform to produce a received word;
an erasure bit selecting step for selecting, as erasure bits, a predetermined number of digits in the received word at which values indicating the reliability information are smallest;
a pattern applying step for applying each of a plurality of possible bit patterns to the erasure bits of the received word to produce composite code words each having, at its bit positions correspponding to the erasure bits of the received word, respective bits of a corresponding one of the possible bit patterns;
a minimum distance decoding step to which each of the composite code words is subjected to determine a plurality of candidate code words;
a step for comparing each of the candidate code words with the received word for each digit and detecting a disagreement or agreement, if any, between each digit of the received word and a corresponding digit of the candidate code word;
a step for summing up only the reliability information for the digits where the received word and each of the candidate code words disagree or agree with each other, thereby producing a sum of the reliability information for each of the candidate code words; and a step for determining one of the candidate code words as the decoded result which produces the minimum or maximum one of the sums of the reliability information.

10. The decoding method according to claim 9, wherein a reversible counter is controlled to enter a count up or down mode depending upon whether the output of the voltage comparator is high or low level, clock pulses of higher rate than the bit rate of the received word are counted by the reversible counter, and for each digit of the received word the count value of the reversible counter corresponding to the difference in the time occupancy ratio is output as the reliability information of the digit and at the same time the reversible counter is reset.

11. The decoding method according to claim 1 or 9 wherein the digits in the received word corresponding to the lowest K valves of the reliability information are erased and replaced successively by $2^K$ of the K-bit patterns to produce $2^K$ candidate received words which are each subjected to the minimum distance decoding to select candidate code words, and one of the selected candidate code words is determined as the decoded result which gives the minimum or maximum one of the sums of the reliability information.

12. A method for decoding block codes, comprising:
a step for receiving a transmitted signal by a plurality of receiving branches to produce demodulated waveforms in the respective receiving branches;

a step for conducting bitwise decoding on the demodulated waveforms to produce received words in the respective receiving branches;

a step for detecting the receiving electric field level for each digit of the received word in each receiving branch;

a step for summing up the receiving electric field levels in the receiving branches at only the corresponding digits of the received words which disagree or agree with "1" and summing up the receiving electric field levels in the receiving branches at only the corresponding digit of the received words which disagree or agree with "0", thereby producing two summations; and a step for determining the "1" or "0" corresponding to the smaller (or larger) one of the two summations as the decoded output of the corresponding digit of the received word.

13. The decoding method according to any one of claims 2, 3, 4, 5, 6, 8, and 12, wherein the plurality of the receiving branches are space diversity branches or branches for receiving the same block code simultaneously transmitted over different transmission channels.

14. The decoding method according to any one of claims 2, 3, 4, 5, 6, 8, and 12, wherein the plurality of the receiving branches are time diversity branches for receiving the same block code transmitted a plurality of times.

15. The decoding method according to any one of claims 1, 3, 4, 5, 6, and 8, wherein the reliability information is the ratio between the detected receiving electric field power and noise power for each digit.

16. The decoding method according to claim 12, wherein reliability information is produced from the two summations for the corresponding digit of the decided received word and the decided received word is subjected to soft decision decoding on the basis of the reliability information for each digit.

* * * * *